(12) United States Patent
Tachibana et al.

(10) Patent No.: US 7,642,945 B2
(45) Date of Patent: Jan. 5, 2010

(54) AD CONVERTER CIRCUIT AND MICROCONTROLLER

(75) Inventors: Suguru Tachibana, Kawasaki (JP); Ikuo Hiraishi, Kawasaki (JP); Azusa Saito, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 0 days.

(21) Appl. No.: 12/035,899

(22) Filed: Feb. 22, 2008

(65) Prior Publication Data

US 2008/0204300 A1 Aug. 28, 2008

(30) Foreign Application Priority Data

Feb. 22, 2007 (JP) .............................. 2007-042497

(51) Int. Cl.
*H03M 1/34* (2006.01)

(52) U.S. Cl. ...................................... 341/163; 341/155

(58) Field of Classification Search ................. 341/155, 341/144, 163, 164
See application file for complete search history.

(56) References Cited

U.S. PATENT DOCUMENTS 5,260,705 A * 11/1993 Inukai ........................ 341/155
5,469,508 A * 11/1995 Vallier ......................... 381/63
6,515,526 B2 * 2/2003 Dairi ........................... 327/156
6,867,723 B1 3/2005 Tachibana et al.
7,068,205 B1 * 6/2006 Hastings et al. ............. 341/164

FOREIGN PATENT DOCUMENTS

| JP | 04-220016 A | 8/1992 |
| JP | 07-264071 A | 10/1995 |
| JP | 2005-86550 A | 3/2005 |

OTHER PUBLICATIONS

Fujitsu Limited Electronic Devices "Fujitsu Semiconductor-Controller Manual F²MC-8FX 8-Bit Microcontroller MB95100A/H Series Hardware Manual," pp. 525-544, Jun. 2006.

* cited by examiner

*Primary Examiner*—Peguy JeanPierre
(74) *Attorney, Agent, or Firm*—Arent Fox LLP

(57) ABSTRACT

A successive approximation type AD converter circuit for comparing an analog input signal with an output analog signal of a DA converter with a comparator to input a digital signal output in accordance with a comparison result to the DA converter to determine a digital signal obtained if the output analog signal of the DA converter is equal to the analog input signal, as an AD-converted output signal, includes: an AD converter for AD-converting the analog input circuit in accordance with a sampling period for sampling the analog input signal and a comparison period for comparing the sampled analog input signal with the output analog signal of the DA converter with the comparator; and setting means for independently setting a cycle time of a first clock signal for determining the sampling period and a cycle time of a second clock signal for determining the comparison period.

16 Claims, 18 Drawing Sheets

Prior Art

US 7,642,945 B2

AD CONVERTER CIRCUIT AND MICROCONTROLLER

TECHNICAL FIELD

The present invention relates to an AD converter circuit for converting an analog signal to a digital signal, and a microcontroller, and more specifically, it relates to a successive approximation type AD converter circuit and a microcontroller provided with the successive approximation type AD converter circuit.

BACKGROUND

Nowadays, a successive approximation type AD converter circuit has been known as an AD converter circuit that is configured in a simpler form and is highly consistent with a CMOS process that enables lower-cost fabrication, and can realize usually-needed AD conversion time and conversion efficiency. Owing to its high consistency with the CMOS process and its smaller footprint, the successive approximation type AD converter circuit is incorporated in a microcontroller (MCU) in many cases. The successive approximation type AD converter circuit is proposed in, for example, following Patent Documents.

[Patent Document 1]
Japanese Unexamined Patent Application Publication No. Hei 4-220016

[Patent Document 2]
Japanese Unexamined Patent Application Publication No. 2005-86550

[Patent Document 3]
Japanese Unexamined Patent Application Publication No. Hei 7-264071

[Non-Patent Document 1]
http://edevice.fujitsu.com/jp/manual/MANUAL1/alllistj.html#WEB3, CM26-10107-1, MB95100A/H SERIES hardware manual

SUMMARY

According to a one aspect of the present invention, a AD converter circuit comprises a comparator for comparing an analog input signal with an output analog signal; a DA converter for outputting the output analog signal according to a digital signal output in accordance with a comparison result from the comparator; a AD converter for AD-converting the analog input signal to the digital signal output in accordance with a sampling period for sampling the analog input signal and comparison period for comparing the sampled analog input signal with the output analog signal of the DA converter, and for outputting an AD-converted output signal if the output analog signal of the DA converter is equal to the analog input signal; and setting means for independently setting a cycle time of a first clock signal for determining the sampling period and a cycle time of a second clock signal for determining the comparison period.

DESCRIPTION OF THE PREFERRED EMBODIMENTS

Figure 1:
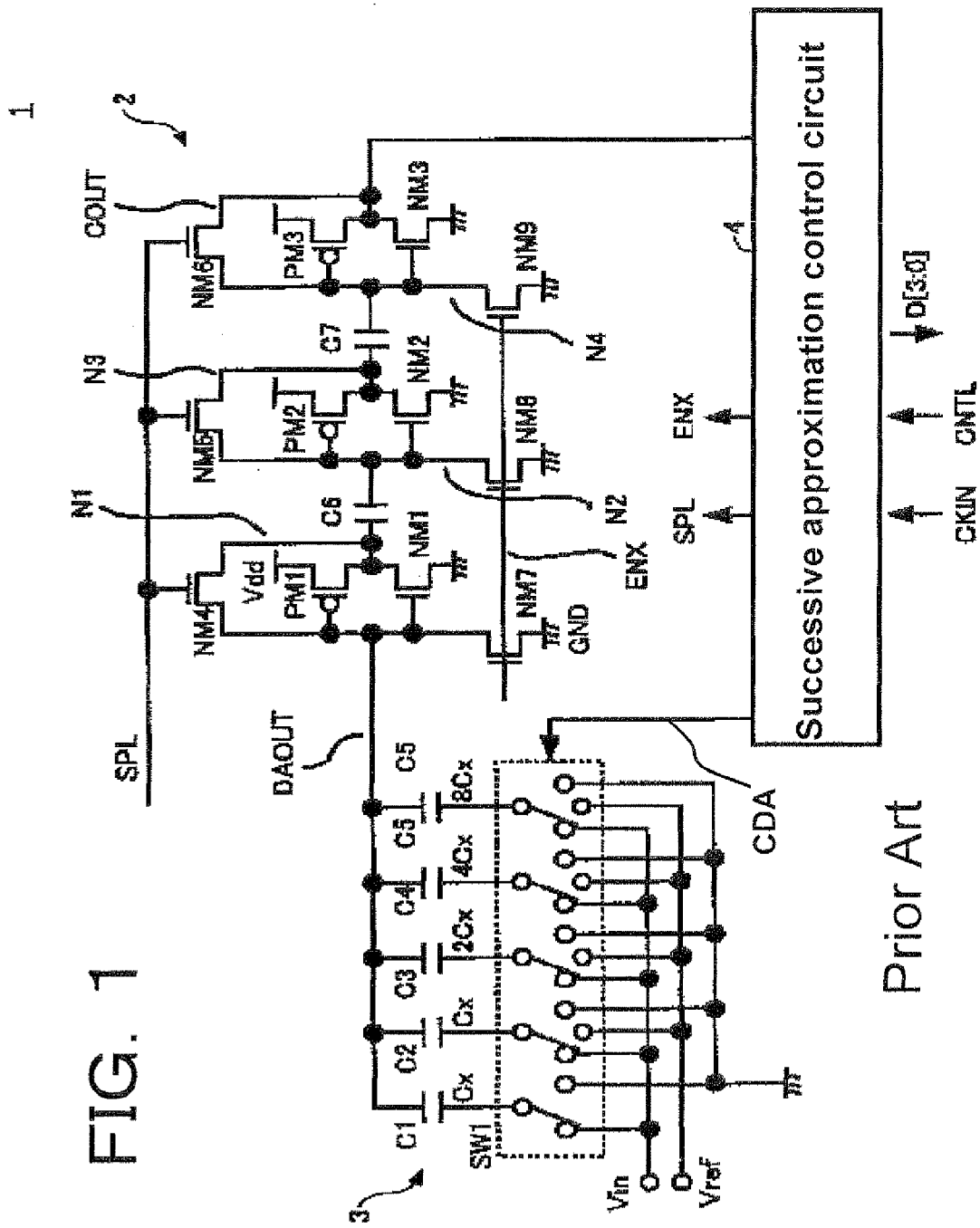
FIG. 1 is a circuit diagram showing an example of a conventional successive approximation type AD converter circuit.

FIG. 1 is a circuit diagram showing an example of a conventional successive approximation type AD converter circuit. A successive approximation type AD converter circuit 1 of FIG. 1 is a charge redistribution type AD converter circuit. In FIG. 1, reference symbol SW1 denotes a switch; C1 to C 7, a capacitor; Vin, an analog input; Vdd, a power supply voltage of, for example, +3 V; Vref, a reference voltage; DAOUT, an output of a capacitance DA converter (DAC) 3; SPL, a control signal to set a sampling period; ENX, a control signal of a comparator 2; CDA, a control signal of the DAC 3; GND, a ground voltage of 0 V; 4, a successive approximation control circuit, CKIN, an input clock of the successive approximation control circuit 4; CNTL, a control signal of the successive approximation control circuit 4; D[3:0], an AD conversion result; N1 to N4, a node in the comparator 2; COUT, an output of the comparator 2 (comparator output); NM1 to NM9, an NMOS transistor; and PM1 to PM3, a PMOS transistor.

The capacitors C1 to C5 constitute the 4-bit capacitor DAC 3. A value of nCx (n is an integer) written along with the individual C1 to C5 represents a capacitance level of one of the capacitors C1 to C5 relative to the other capacitors. As indicated by 1Cx, 2Cx, 4Cx, or 8Cx, a weighted code is a binary one in this example. In the example of FIG. 1, the circuit is configured on the assumption that a 4-bit AD converter circuit is constituted of the 4-bit capacitor DAC 3 (C1 to C5), for ease of illustration. Further, the switch SW1 during sampling is illustrated in FIG. 1. Upon sampling, the capacitors C1 to C5 are charged with a potential of the analog input Vin.

Figure 2:
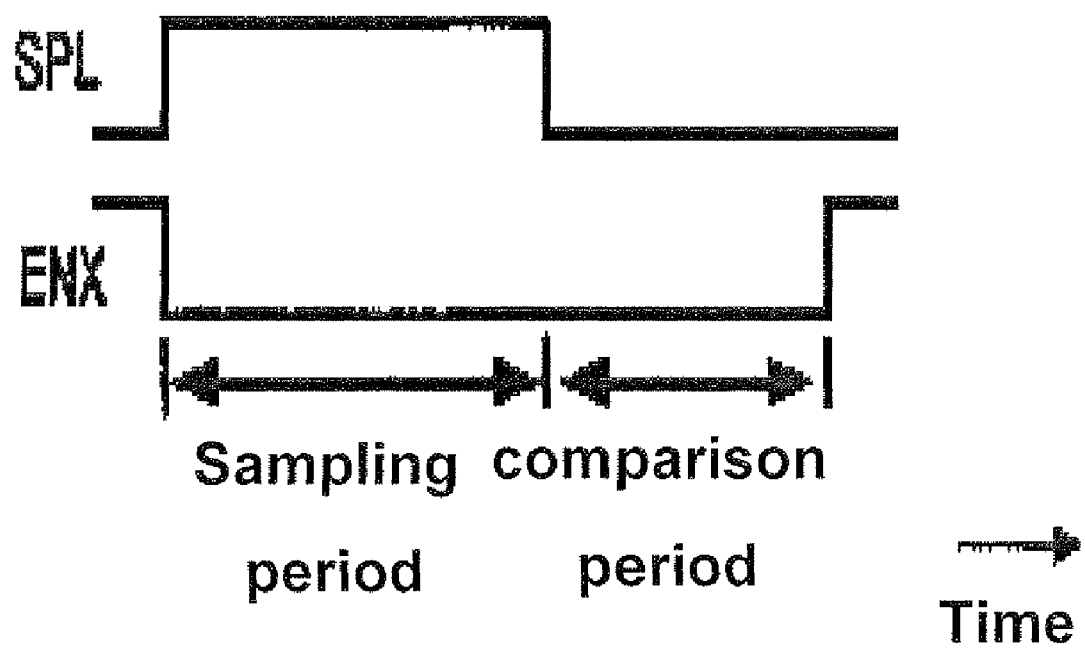
FIG. 2 is a timing chart illustrating operations of the successive approximation type AD converter circuit of FIG. 1.

FIG. 2 is a timing chart of an operation of the successive approximation type AD converter circuit 1, which shows a waveform example of a control signal. The operation of the successive approximation type AD converter circuit 1 is explained with reference to FIG. 2.

The successive approximation type AD converter circuit 1 first samples the analog input potential Vin and then repeats comparison corresponding to its resolution to convert the sampled analog potential into a digital value.

Operations of the individual components in a sampling period are described. In the successive approximation type AD converter circuit 1, the control signal SPL is set to a high (H) level and the control signal ENX is set to a low (L) level during the sampling period. Since the control signal ENX is at the L level, the transistors NM7, NM8, and NM9 are turned off (off-state) to allow the comparator 2 to operate. Since the control signal SPL is at the H level, the transistors NM4, NM5, and NM6 are turned on (on-state), so a potential of the node N1 and a potential of the output DAOUT, a potential of the node N2 and a potential of the node N3, and a potential the node N4 and a potential of the comparator output COUT are equal to each other. Since the input potentials and output potentials of the transistors PM1 and NM1, which constitute an inverter, are equal to each other, the potential of the node N1 and the potential of the output DAOUT become a logical threshold of the transistors PM1 and NM1. The same holds true of the potentials of the nodes N2, N3, and N4, and the output COUT.

If a logical threshold of the first inverter (PM1 and NM1) is different from a logical threshold of the second inverter (PM2 and NM2), a potential corresponding to the difference is charged in the capacitor C6 to compensate for the offset. The capacitor C7 operates similar to the capacitor C6.

Under such a condition that a potential of the output DAOUT is a logical threshold of the first inverter (PM1 and NM1), the switch SW1 is operated to connect bottom plates of the capacitors C1, C2, C3, C4, and C5 (nodes on the switch SW1 side) to the analog input Vin. In this way, the potential of the output DAOUT is set to a logical threshold voltage VTL and in addition, the analog input potential Vin is applied to one ends of the capacitors C1 to C5 to sample the analog input Vin, and the capacitors C1 to C5 are charged in accordance with the potential of the analog input Vin.

Here, charges Q accumulated in top plates of the capacitors C1 to C5 (nodes on the output DAOUT side) in a sampling operation are given by Expression (1) below.

$$Q = -16Cx(Vin - VTL) \quad (1)$$

After the completion of the sampling operation, the successive approximation type AD converter circuit 1 performs comparison to determine a value on a bit basis in order from MSB of digital data toward LSB.

Operations of the individual components in this comparison period are described. The successive approximation control circuit 4 sets the control signal SPL to L level and turns off the transistors NM4, NM5, and NM6 constituting the switch such that the potential of the output DAOUT is determined by redistributing charges that are accumulated in the capacitors C1 to C5 during the sampling operation, into the capacitors C1 to C5. Incidentally, in the following description, redistribution of charges accumulated in the capacitors C1 to C5 into the capacitors C1 to C5 is referred to as "redistribution of charges". Moreover, the successive approximation control circuit 4 controls the switch SW1 with the control signal CDA to connect one end of the capacitor C1 to the ground (GND). Further, the successive approximation control circuit 4 appropriately controls the switch SW1 with the control signal CDA so as to selectively connect one ends of the capacitors C2 to C5 to the reference voltage Vref or the ground GND.

At this point, one ends of some of the capacitors C1 to C5 are connected to the reference voltage Vref. That is, it is assumed that the total capacitance of the capacitors out of the capacitors C1 to C5, which are applied with the reference potential Vref at one end, is mCx (m is an integer of 0 to 15). This is because only the capacitors C2 to C5 are selectively connectable to a power supply or the ground. At this time, the total capacitance of the capacitors out of the capacitors C1 to C5, which are connected to the ground at one end, is (16−m) Cx. Incidentally, an input capacitance of the comparator 2 (transistors PM1 and NM1 etc.) and a parasitic capacitance of wiring are not considered for ease of explanation.

Assuming that the charges Q given by Expression (1) above are kept, and the potential of the output DAOUT is Vx as a result of the charge redistribution, the charges Q accumulated in the top plates of the capacitors C1 to C5 are derived from Expression (2) below.

$$Q = -mCx(Vref - Vx) + (16 - m)Cx(Vx) \quad (2)$$

Since the charges given by Expression (2) are equal to the charges given by Expression (1), the potential Vx of the output DAOUT after the charge redistribution is derived from Expression (3) below under this condition.

$$Vx = [(m/16)Vref - Vin] + VTL \quad (3)$$

As apparent from Expression (3) above, the comparator 2 (transistors PM1, NM1, PM2, NM2, PM3, and NM3) determines whether or not the potential Vx of the output DAOUT is higher than the logical threshold voltage VTL to thereby determine whether or not the analog input potential Vin is higher than a given potential (m/16)Vref out of the 16 potentials obtained by dividing the reference potential Vref.

In short, the successive approximation type AD converter circuit 1 of FIG. 1 controls the switch SW1 in accordance with a value of the 4-bit digital data (CDA) as a comparison target and determines whether or not the potential Vx of the output DAOUT is higher than the logical threshold voltage VTL. As a result, the successive approximation type AD converter circuit 1 can determine a 4-bit value of digital data in accordance with the analog input potential Vin.

In general, the analog input potential Vin is compared with a given potential (m/16)Vref out of the 16 potentials obtained by dividing the reference potential Vref in such a manner that a potential (½)Vref and a potential Vin are first compared and then a potential (¼)Vref or (¾)Vref and a potential Vin are compared in order to minimize the number of comparison operations. If the first comparison result shows that Vin is higher than (½)Vref, (¾)Vref and Vin are compared with each other. If Vin is lower than (¾)Vref, Vin is within a range of (¾)Vref to (½)Vref, so Vin and (⅝)Vref are compared with each other next. In this way, a range of the analog potential is narrowed down to thereby obtain digital data corresponding to the analog input potential Vin, that is, the AD conversion result D[3:0].

As described above, in the successive approximation type AD converter circuit 1, the analog signal is sampled and the sampled signal is compared with a reference voltage (or a potential obtained by dividing the reference voltage) to obtain the AD conversion result. To obtain a correct AD conversion result, it is necessary to properly sample the analog signal. An equivalent impedance of a signal source that generates the analog input potential Vin is limited, so the capacitors C1 to C5 need to be charged with a series resistor composed of the equivalent impedance of the signal source and a resistor of the switch SW1 in order to charge the analog input Vin with potentials of the bottom plate of the capacitors C1 to C5, for example. That is, a period for charging the capacitors C1 to C5 is limited in accordance with a time constant determined by the capacitance values of the capacitors C1 to C5 and the resistor of the signal source impedance and the switch SW1. In other words, unless the capacitors C1 to C5 are charged over a sampling period several times longer than the time constant, charges accumulated in the capacitors C1 to C5 get out of the charges Q given by Expression (1).

Figure 3:
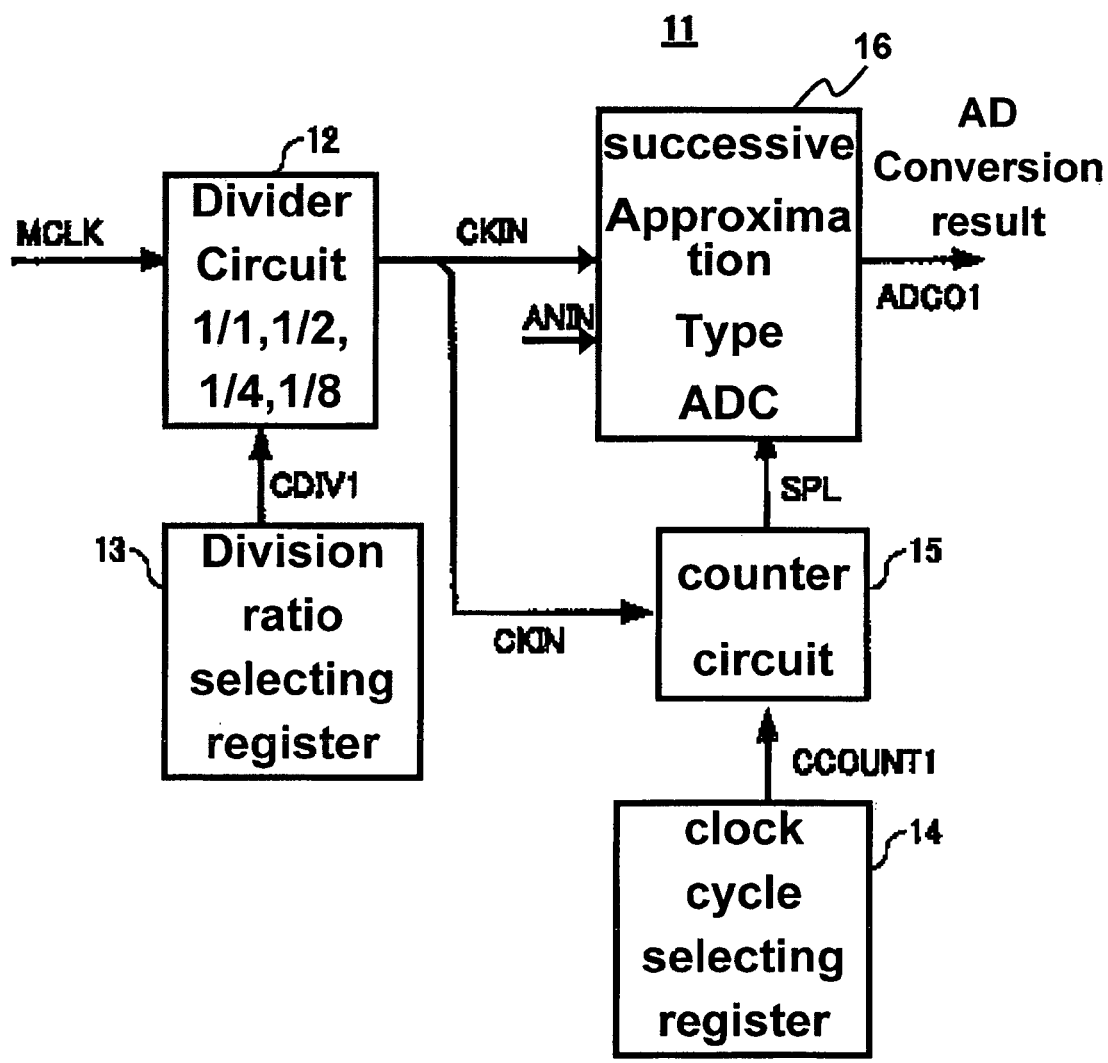
FIG. 3 is a block diagram showing a successive approximation type AD converter circuit incorporated in a microcontroller.

Under such circumstances, a successive approximation type AD converter circuit having such a circuit configuration as to realize a variable sampling period has been proposed. FIG. 3 is a block diagram showing the successive approximation type AD converter circuit having such a circuit configuration. Since an equivalent impedance of the signal source to generate the analog input potential Vin varies, a successive approximation type AD converter circuit 11 of FIG. 3 is configured to change a sampling period in accordance with an equivalent impedance of the signal source to generate the analog input potential Vin. The circuit configuration of the successive approximation type AD converter circuit 11 is intended for use in the MCU. The configuration substantially equivalent to the successive approximation type AD converter circuit 11 is disclosed in, for example, Non-Patent Document 1.

The successive approximation type AD converter circuit 11 includes a divider circuit 12, a division ratio selecting register 13, a clock cycle selecting register 14 for selecting a clock frequency in a sampling period, a counter circuit 15 for setting a sampling period, and a successive approximation type AD converter (ADC) 16 corresponding to a main circuit part of the successive approximation type AD converter circuit 11, which are connected with one another as shown in FIG. 3. The ADC 16 has the same circuit configuration as the successive approximation type AD converter circuit 1 of FIG. 1, for example. In FIG. 3, reference symbol MCLK denotes a clock signal of the MCU; CKIN, a clock signal obtained by dividing the clock signal MCLK with the divider circuit 12; ANIN, an analog input signal; ADCO1, an AD conversion result of the ADC 16; CDIV1, a control signal of the divider circuit 12; CCOUNT1, a control signal of the counter circuit 15; and SPL, a control signal for setting a sampling period (the same signal as SPL of FIG. 1).

Figure 4:
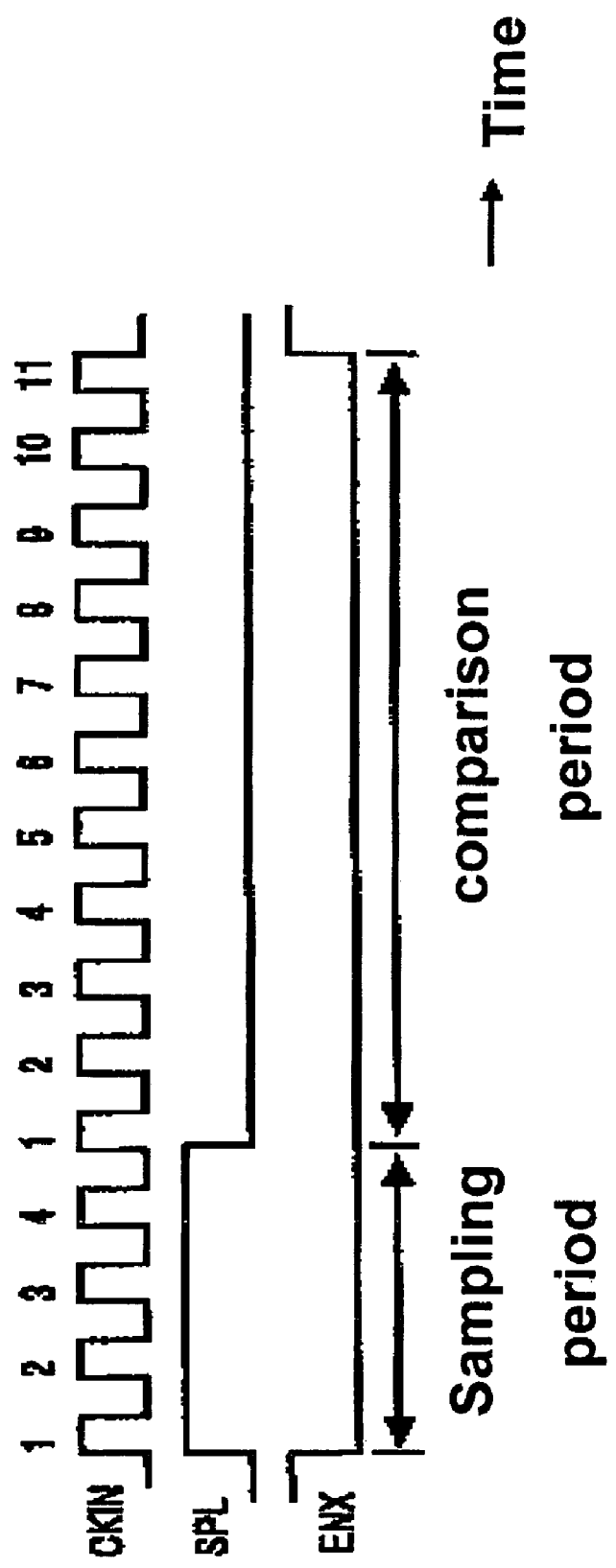
FIG. 4 is a timing chart illustrating operations of the successive approximation type AD converter circuit of FIG. 3.

FIG. 4 is a timing chart illustrating operations of the successive approximation type AD converter circuit 11 of FIG. 3. The divider circuit 12 of FIG. 3 divides the clock signal MCLK and outputs the clock signal CKIN. The counter circuit 15 counts the number of cycles of the clock signal CKIN to determine a sampling period. If the successive approximation type AD converter circuit 11 is incorporated into the MCU, the clock signal of the successive approximation type AD converter circuit 11 is generally generated on the basis of the clock signal MCLK of the MCU. Since the sampling period (sampling time) should be determined in accordance with an impedance of a signal source that generates an analog signal to be AD-converted, the divider circuit 12 is used in the configuration of FIG. 3. In the case of AD-converting analog signals different in signal source impedance by use of the same successive approximation type AD converter circuit 11, a sampling capacitance (the total capacitance of the capacitors C1 to C5 of FIG. 1, for example) of the successive approximation type AD converter circuit 11 is constant, so a sampling period needs to be set longer if the signal source impedance is high.

On the other hand, a period of the clock signal MCLK of the MCU is determined in accordance with, for example, a requisite processing ability and thus set to a predetermined value irrespective of a request from the successive approximation type AD converter circuit 11. Hence, in order to change the sampling period of the ADC 16 in accordance with the analog signal source impedance, it is necessary to change the number of cycles counted with the counter circuit 15 and a period of the clock signal CKIN. FIG. 3 shows selectable division ratios of the divider circuit 12, 1/1, 1/2, 1/4, and 1/8, by way of example. The values of the division ratios are set in the register 13 by use of software and one of them is selected, making it possible to selectively set a period of the clock signal CKIN to a value 1-, 2-, 4-, or 8-times longer than the period of the clock signal MCLK, for example. Moreover, if the number of cycles counted with the counter circuit 15 is set in the register 14 by use of software, the software makes a period in which the signal SPL of FIG. 4 is at H level, that is, a sampling period variable.

These techniques realize a function of setting the sampling period and AD conversion time of the successive approximation type AD converter circuit 11 in accordance with an analog signal source impedance with a programmer.

The successive approximation type AD converter circuit 11 of FIG. 3 is used to realize a function of setting the sampling period (sampling time) and the AD conversion period (AD conversion time) of the successive approximation type AD converter circuit 11 in accordance with an analog signal source impedance with a programmer. However, the inventors have found that the following problems unique thereto remain to be solved in the case of incorporating the successive approximation type AD converter circuit 11 into the MCU.

The clock signal MCLK of the MCU is set to a predetermined value in accordance with a requisite processing ability. Further, the cycle time of the clock signal MCLK varies depending on an oscillation circuit parameter of an oscillator operated by a user of the MCU and is not uniquely determined at the design stage of the successive approximation type AD converter circuit 11. Therefore, the MCU of FIG. 3 is configured such that the divider circuit 12 generates a clock signal CKIN for the ADC 16 based on the clock signal MCLK and a count value of the counter circuit 15 for determining a sampling period can be set by software.

If the analog signal source impedance is high, it is necessary to set the sampling period long. Thus, it is assumed that the divider circuit 12 increases the cycle time of the clock signal CKIN of the ADC 16, for example, and in addition, the number of cycles of the counter circuit 15 for setting a sampling period is increased. During the comparison period, at least 10 cycles are constantly required of the 10-bit successive approximation type ADC 16 (for example, 10.5 cycles in consideration of data transfer as well), which leads to a first problem that the comparison period as well as the sampling time is increased as the cycle time of the clock signal CKIN of the ADC 16 is increased.

FIG. 4 shows the first problem. If the sampling period and the comparison period are prescribed with the same clock signal CKIN, in the case of increasing the cycle time of the clock signal CKIN in response to a request about the sampling period, the number of cycles in the comparison period is fixed (to, for example, 10.5 cycles), so the comparison period is increased.

The first problem is described in more detail. The sampling period can be made long by increasing the number of cycles set in the counter circuit 15. However, the circuit scale and a bit rate necessary for settings are increased, so only the limited count value can be set in the counter circuit 15. Further, it is desirable to decrease the cycle time of the clock signal MCLK in order to increase the processing ability of the MCU, but the comparison time of the ADC 16 cannot be shortened to a certain level or less. Thus, it is necessary to set plural options for a division ratio of the divider circuit 12 so as to set the cycle time of the clock signal CKIN independently of the clock signal MCLK. If the conceivable division ratios of the divider circuit 12 and the conceivable numbers of cycles of the counter circuit 15 are combined, the maximum possible sampling period is a period obtained in the case where the cycle time of the clock signal CKIN and the number of count cycles of the counter circuit 15 are maximized.

According to the above settings, the sampling period can be maximized, but the comparison period becomes long along with the increase in cycle time of the clock signal CKIN as described above. During the comparison period, charges stored (accumulated) in the sampling capacitors C1 to C5 of FIG. 1 are used to compare the analog input potential with a divided reference voltage, for example. However, in an actual circuit, a leak current flows into the capacitors C1 to C5 and a circuit portion for controlling the capacitors. For example, if the successive approximation type AD converter circuit 1 of FIG. 1 is used, a drain junction of the transistor NM4 is connected to a node corresponding to the output DAOUT, so a leak current flows through the drain junction, making it impossible to keep charges accumulated in the capacitors C1 to C5 over an unlimited, long period.

That is, if the comparison period is set to the given maximum value or less in consideration of a leak current in the actual circuit, the sampling period is not applicable with the cycle time of the clock signal CKIN and the count value of the counter circuit 15.

Figure 5:
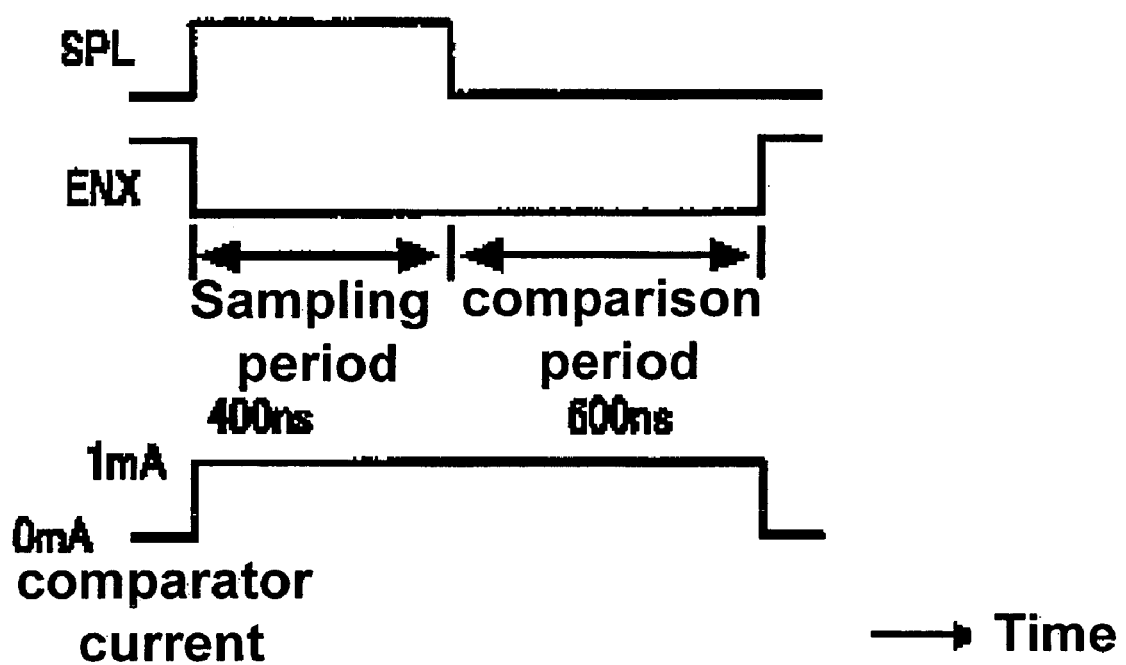
FIG. 5 is a timing chart illustrating a problem of the successive approximation type AD converter circuit of FIG. 3.
Figure 6:
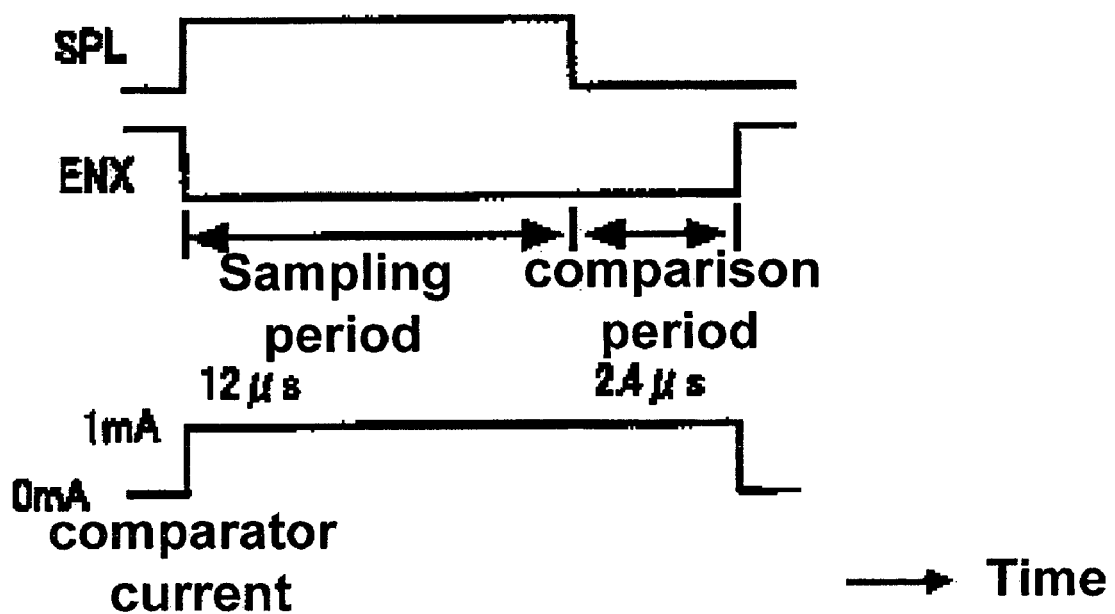
FIG. 6 is a timing chart illustrating a problem of the successive approximation type AD converter circuit of FIG. 3.

FIGS. 5 and 6 are timing charts illustrating a second period of the conventional circuit found by the inventors. As for the successive approximation type AD converter circuit 11 incorporated in the MCU, since the MCU is a general-purpose LSI, the incorporated successive approximation type AD converter circuit 11 can be used in various fields. Thus, the circuit may be adopted for such a particular use that AD-conversion needs to be performed at as high speed as possible because of low impedance of the analog signal source or that a sampling period needs to be long because of a high impedance of the analog signal source. FIG. 5 shows an example where AD-conversion is performed in an AD-conversion period of, for example, 1 μs. FIG. 6 shows an example where AD-conversion is performed in an AD-conversion period of, for example, 14.4 μs because of high impedance of the analog signal source.

A description is made of problems in the case where the same successive approximation type AD converter circuit 16 is used under the condition of FIG. 5 and under the condition of FIG. 6. Under the condition of FIG. 5, the cycle time of the clock signal CKIN is about 60 ns for illustrative purposes. In this example, the sampling period is set to 7 cycles in terms of clock signal CKIN, the sampling period is set to about 400 ns, and the comparison period is set to about 600 ns on the assumption that the 10-bit successive approximation type ADC 16 is used. A period necessary for 1-bit comparison is about 60 ns, so a comparator current is 1 mA by way of example. An impedance of the analog signal source under the condition of FIG. 5 is, for example, 1 kΩ. FIG. 5 shows a state where a comparator current of 1 mA flows in the AD conversion period of 1 μs.

Under the condition of FIG. 6, an impedance of the analog signal source is, for example, 30 kΩ. The cycle time of the clock signal CKIN is set to about 240 ns and the sampling period is set to 50 cycles in terms of clock signal CKIN. The sampling period is about 12 μs and the comparison period is about 2400 ns.

An impedance of the analog signal source is high, so the sampling period needs to be increased. However, a comparator current of the ADC 16 is set to, for example, 1 mA such that the circuit can operate even in the shortest AD conversion period of 1 μs, for example. Therefore, the comparator current of 1 mA also flows under the condition of FIG. 6. FIG. 6 shows a state in which the comparator current of 1 mA flows in the AD conversion period of 14.4 μs. If the AD conversion period is 1 μs, only a current of 1 mA flows in a period of 1 μs. If the AD conversion period is 14.4 μs, a current of 1 mA flows in a period of 14.4 μs, and an energy necessary for conversion is much larger than an energy necessary for highest-speed conversion.

In short, in the successive approximation type AD converter circuit 11 of FIG. 3, if an impedance of the analog signal source is high and the sampling period and the AD conversion period are set long, the current of the successive approximation type ADC 16 are constant, resulting in the second problem that an energy necessary for conversion is much larger than an energy for the highest-speed conversion.

A first object of the embodiments is to solve the above first problem, that is, a problem that if a cycle time of a clock signal CKIN is set long in response to a request about a sampling period in order to prescribe a sampling period and a comparison period in accordance with the same clock signal CKIN, since the number of cycles in the comparison period is fixed, the comparison period is increased.

A second object of the embodiments is to solve the above second problem, that is, a problem that if an impedance of an analog signal source is high, and a sampling period and an AD conversion period are set long, a current of the successive approximation type AD converter circuit is fixed, so an energy necessary for conversion is much larger than an energy for the highest-speed conversion.

According to embodiments, A successive approximation type AD converter circuit compares an analog input signal voltage with an analog signal voltage from a DAC with a comparator and outputs a digital signal (digital data) in accordance with a comparison result. The digital signal is input to the DAC, and a digital signal obtained when an analog signal voltage output of the DAC is equal to the analog input signal voltage is determined as an AD-converted output. According to embodiments, the successive approximation type AD converter circuit includes: an AD converter for AD-converting the analog input circuit in accordance with a sampling period for sampling the analog input signal and a comparison period for comparing the sampled analog input signal with the output analog signal of the DA converter with the comparator; and setting means for independently setting a cycle time of a first clock signal for determining the sampling period and a cycle time of a second clock signal for determining the comparison period.

To be specific, the circuit according to the embodiments includes a first divider circuit for dividing a clock signal of an MCU to generate a first clock signal for determining a sampling period, and a second divider circuit for dividing a clock signal of the MCU to generate a second clock signal for determining a comparison period of a comparator in a successive approximation type ADC. The first clock signal is counted with a counter circuit to determine a sampling period. The successive approximation type ADC successively performs comparison in a comparison period on the basis of the sampling period determined with the counter circuit and the second clock signal. A division ratio of the first and second divider circuits is selected by setting a value in each register. Further, a count value of the counter circuit is also selected by setting a value in each register. A software (program) is used to set the register for setting a comparator current such that a current of a comparator in the successive approximation type ADC is set to the minimum amount in accordance with a sampling period and a cycle time of the first clock signal. The first and second divider circuits and counter circuits constitute the above setting means. Incidentally, the register may be included in the above setting means or not included.

That is, according to the embodiments, in order to attain the above first object, the first clock signal for determining a sampling period and the second clock signal for determining a comparison period are different clock signals. Further, the first and second divider circuits for generating first and second clock signals in accordance with a clock signal of the MCU are provided. Registers for setting division ratios of the first and second divider circuits are provided in accordance with the first and second divider circuits, respectively. Moreover, a counter circuit for counting the number of cycles of the first clock to determine a sampling period is provided, and a register is provided for storing a count value thereof.

Further, in order to attain the above second object, according to the embodiments, a register is provided for setting a current value of a comparator current of the successive approximation type ADC with software.

According to the embodiments, a cycle time of the first clock signal for determining a sampling period is set long and in addition, a cycle time of the second clock signal for determining a comparison period can be set shorter than the above cycle time. That is, a sampling period (sampling time) is set to the maximum value that is determine in accordance with the maximum count value of the counter circuit and the maximum cycle time of the first clock signal while a comparison period can be independently set in accordance with the second clock signal. Hence, it is possible to set the maximum sampling period as well as set a comparison period equal to or smaller than the predetermined maximum value determined by a leak current of a circuit portion.

Further, in the case of increasing the sampling period to increase the comparison period not to make up a substantial portion of the total AD conversion period, a current of the successive approximation type ADC can be set smaller. As a result, an energy necessary for AD conversion can be saved to reduce average power consumption of the successive approximation type ADC.

Further, a current of the successive approximation type ADC is directly set by use of software to thereby optimize a current of the successive approximation type ADC. A clock signal frequency of the MCU varies depending on an oscillator externally connected to the MCU and thus, a clock signal of the MCU is not determined until a user of the MCU completes board or system design. Therefore, the sampling period, the AD conversion period, and the comparison period of the comparator are not determined in accordance with the count value of the counter circuit alone and are known by only the MCU user who grasps the number of cycles of the clock signal of the MCU, the division ratio, or the like. Therefore, a programmer, who knows absolute value of these periods (time), needs to designate a value to minimize the total current on the basis of the requisite current by use of a program (software), but the embodiments can provide means for optimizing such a current.

If an impedance of an analog signal source is high, it is necessary to set the sampling period long. In this case, the comparison time of the comparator is set as long as possible. Along with the increase in the comparison time of the comparator, power consumption of the comparator of the successive approximation type ADC can be reduced. Hence, if the AD conversion period (comparison time of the comparator) is long, average power consumption of the ADC can be reduced.

Accordingly, according to the embodiments an AD converter circuit and a microcontroller, which can optimize an AD conversion period and power consumption in accordance with an impedance of an analog signal source, can be configured.

Figure 7:
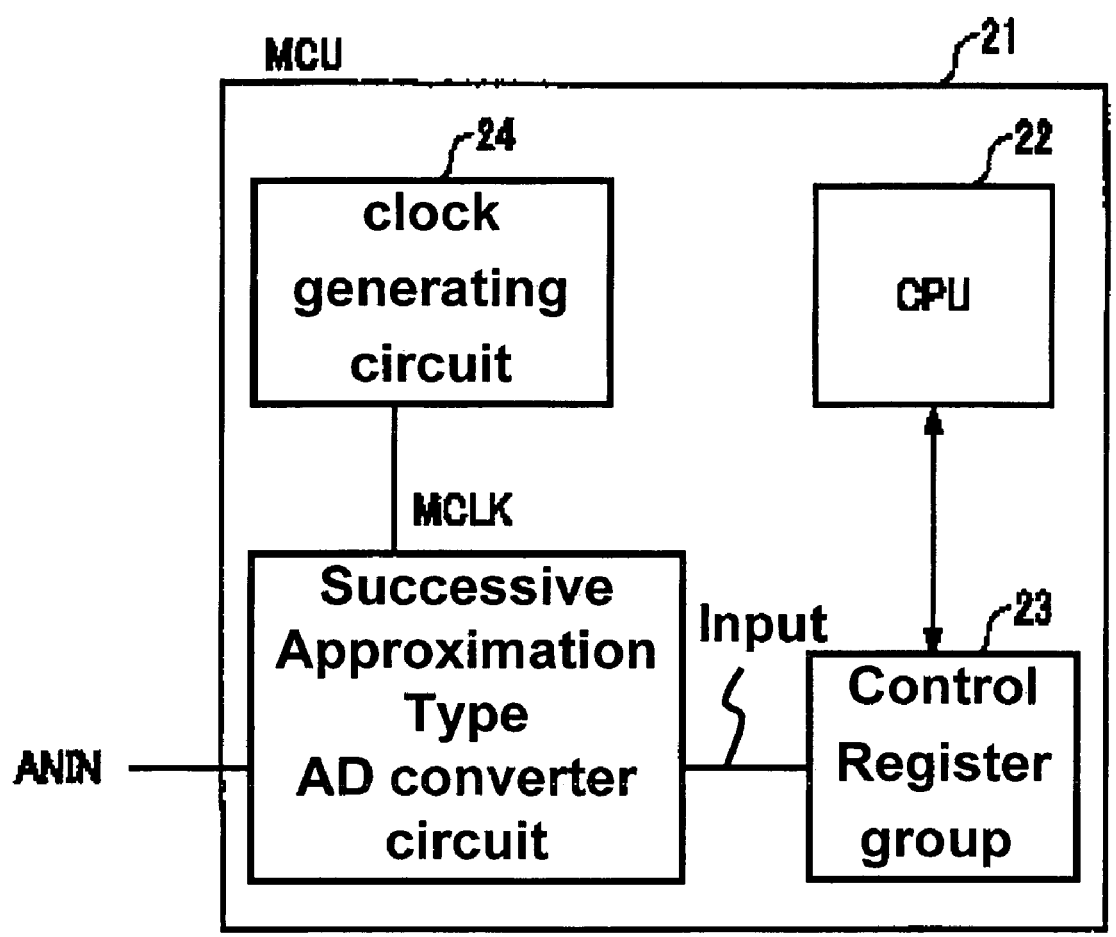
FIG. 7 is a block diagram showing a microcontroller circuit according to an embodiment.

FIG. 7 is a block diagram of a microcontroller according to an embodiment. A microcontroller (MCU) 21 includes a CPU 22, a control register group 23, a clock generating circuit 24, and a successive approximation type AD converter circuit 25, which are connected as shown in FIG. 7.

The CPU 22 executes control over the entire MCU 21. Further, the CPU 22 can set values of each register in the control register group 23 and each register in the successive approximation type AD converter circuit 25 by use of software. The control register group 23 is composed of plural registers for storing data and parameters used by the CPU 22. The control register group 23 may include one or more registers for storing data or parameters used by the successive approximation type AD converter circuit 25. The clock generating circuit 24 generates a clock signal MCLK input to the successive approximation type AD converter circuit 25. The successive approximation type AD converter circuit 25 performs AD-conversion of an analog input signal ANIN on the basis of the clock signal MCLK. A feature of the MCU 21 resides in configuration and operations of the successive approximation type AD converter circuit 25.

Figure 8:
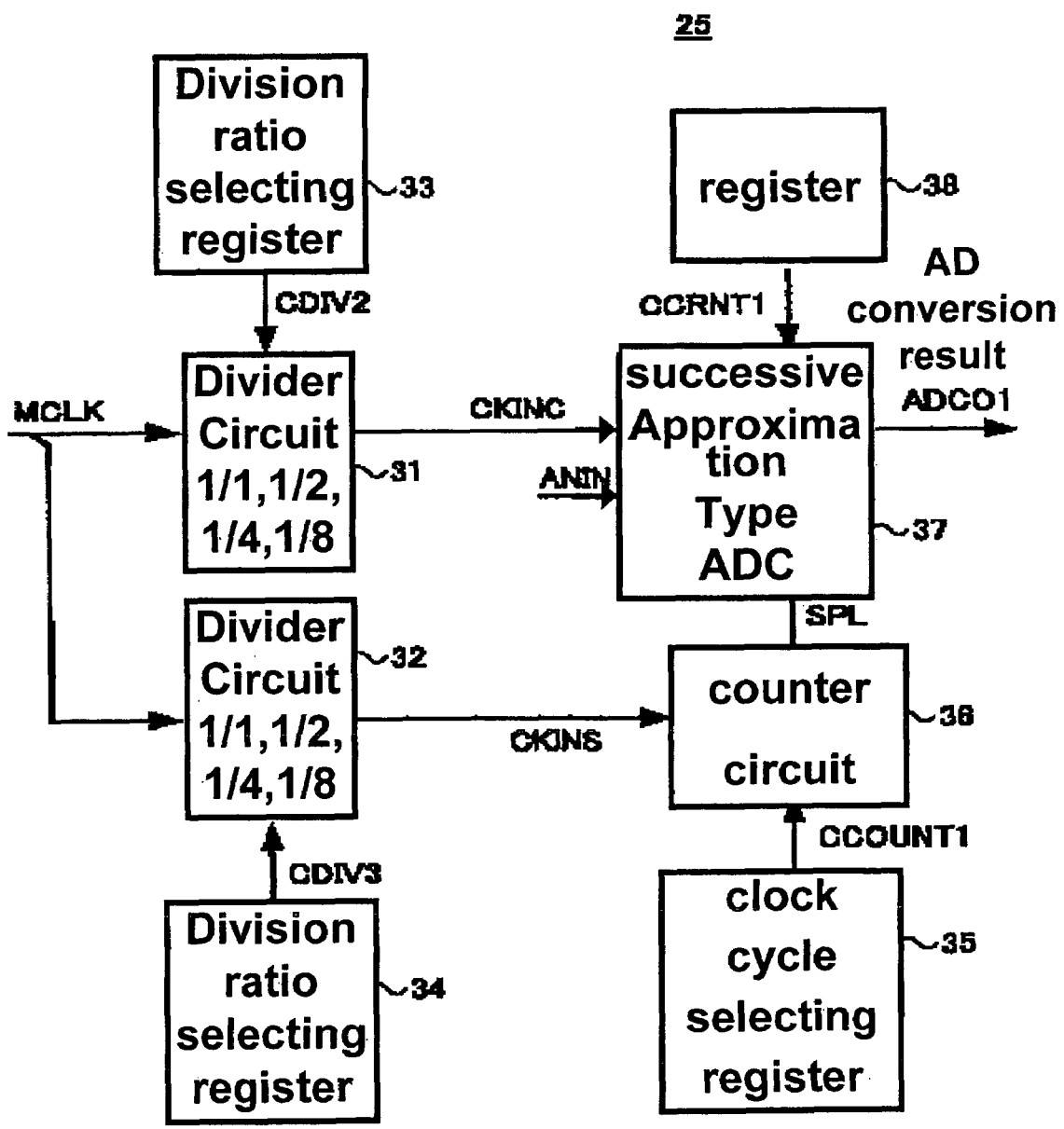
FIG. 8 is a block diagram showing a successive approximation type AD converter circuit according to an embodiment.

FIG. 8 is a circuit diagram showing an AD converter circuit according to an embodiment. The successive approximation type AD converter circuit 25 includes divider circuit 31 and 32, division ratio selecting registers 33 and 34, a clock cycle selecting register 35 for selecting a clock frequency in a sampling period, a counter circuit 36 for setting the sampling period, a successive approximation type AD converter (ADC) 37 constituting a main circuit part of the successive approximation type AD converter circuit 25 that makes a comparator current etc. variable, and a register 38 used for setting the comparator current of the ADC 37 with software, which are connected as shown in FIG. 8. Some of the registers 33, 34, 35, and 38 may be provided in the control register group 23 of FIG. 7.

In FIG. 8, reference symbol MCLK denotes a clock signal of the MCU 21 where the successive approximation type AD converter circuit 25 is incorporated; CKIN, a clock signal obtained by dividing the clock signal MCLK with the divider circuit 31; CKINS, a clock signal obtained by dividing the clock signal MCLK with the divider circuit 32; ANIN, an analog input signal; ADCO1, an AD conversion result of the ADC 37; CDIV2, a control signal of the divider circuit 32; CDIV3, a control signal of the divider circuit 31; CCOUNT1, a control signal of the counter circuit 36; SPL, a control signal for setting a sampling period of the ADC 37; and CCRNT1, a control signal for controlling a current of the ADC 37.

Figure 9:
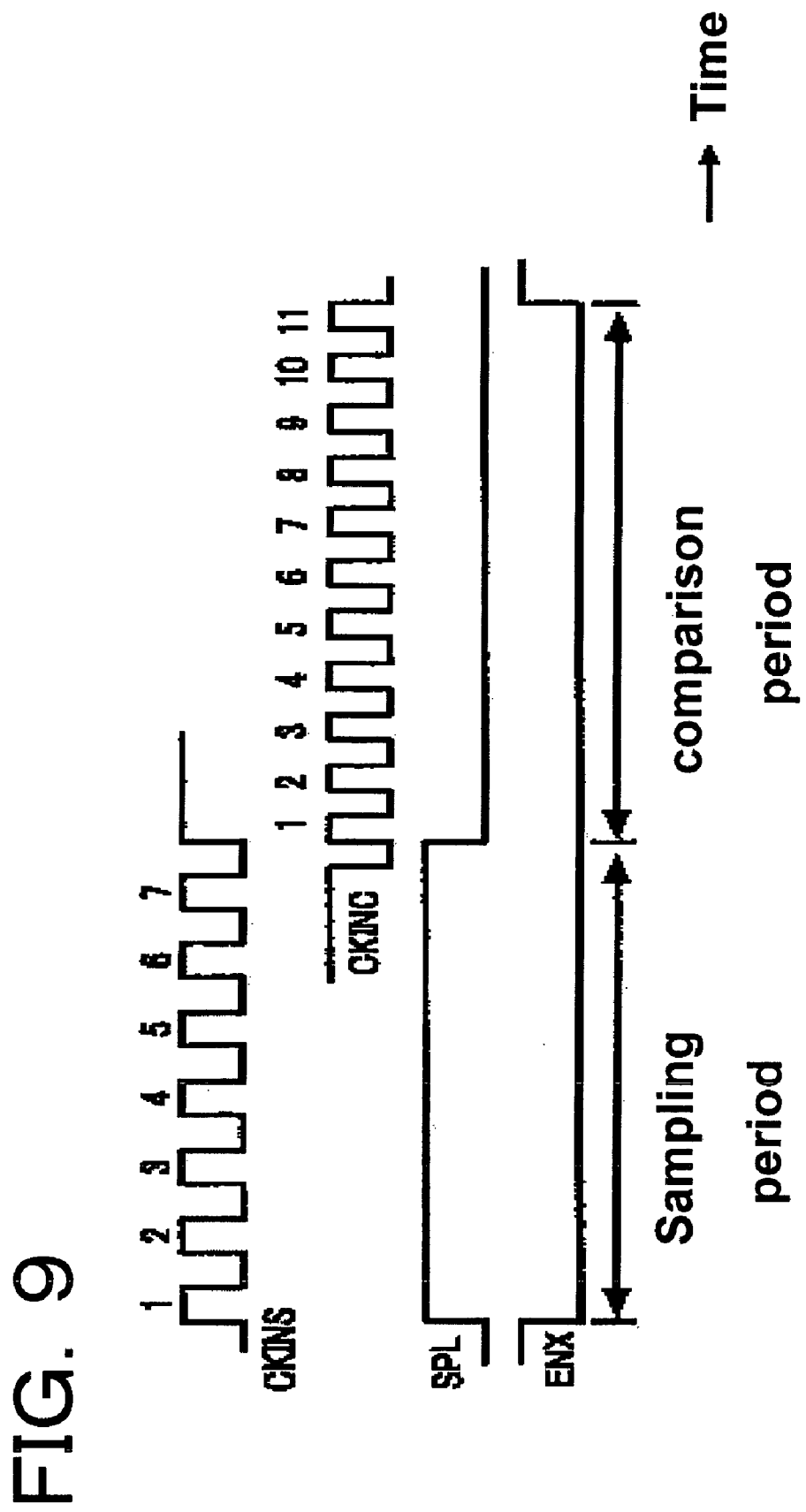
FIG. 9 is a timing chart illustrating operations of the successive approximation type AD converter circuit of FIG. 8.

Referring also to FIG. 9, operations of each component of the successive approximation type AD converter circuit 25 of FIG. 8 are explained. FIG. 9 is a timing chart illustrating operations of the successive approximation type AD converter circuit 25. The divider circuit 31 of FIG. 8 divides the clock signal MCLK of the MCU 21 and outputs a clock signal CKINC for determining a comparison period (comparison time). The divider circuit 32 divides the clock signal MCLK of the MCU 21 and outputs a clock signal CKINS for determining a sampling period (sampling time). The counter circuit 36 counts the number of cycles of the clock signal CKINS to determine the sampling period. The ADC 37 performs comparison on the basis of the clock signal CKINC.

FIG. 8 shows selectable division ratios of the divider circuits 31 and 32, 1/1, 1/2, 1/4, and 1/8, by way of example. The values of the division ratios are set in the division ratio selecting register 33 by use of software and one of them is selected, making it possible to selectively set a period of the clock signal CKINC to a value 1-, 2-, 4-, or 8-times longer than the period of the cock signal MCLK, for example. The values of the division ratios are set in the division ratio selecting register 34 by use of software and one of them is selected, making it possible to selectively set a period of the clock signal CKINS to a value 1-, 2-, 4-, or 8-times longer than the period of the cock signal MCLK, for example. Moreover, if the number of cycles counted with the counter circuit 36 is set in the clock cycle selecting register 35 by use of software, the software makes a period in which the control signal SPL for setting a sampling period of the ADC 37 of FIG. 9 is at H level, that is, a sampling period (sampling time) variable.

If the clock signal CKINS for determining a sampling period and the clock signal CKINC for determining a comparison period are different clock signals, and the division ratio selecting registers 33 and 34 for setting division ratios of the divider circuits 31 and 32 for generating the clock signals CKINS and CKINC, respectively, on the basis of the clock signal MCLK of the MCU 21 are provided, the cycle time of the clock signal CKINS for determining a sampling period can be set long, and the cycle time of the clock signal CKINC for determining a comparison period can be set shorter than the above cycle time. as shown in FIG. 9. In FIG. 9, denoted by ENX is a control signal for an AD-conversion period (AD-conversion time), that is, a control signal of a comparator in the ADC 37.

In short, the sampling period can be set to the maximum value that is determined on the basis of the maximum count value of the counter circuit 36 and the maximum cycle time of the clock signal CKINS and in addition, the comparison period can be set independently of the clock signal CKINC, so the sampling period can be set to the maximum value and the comparison period can be set equal to or smaller than the predetermined maximum value that is determined in accordance with a leak current of a circuit portion.

The register 38 of FIG. 8 is intended to set a current value of a comparator current or the like in the ADC 37 by use of software. The register 38 is provided to set the comparator current of the ADC 37 (and a current of the other components in the ADC 37) by way of software, so if the comparison period is set long, a current of the ADC 37 can be set smaller. As a result, an energy necessary for AD-conversion can be saved, and average power consumption can be reduced.

Figure 10:
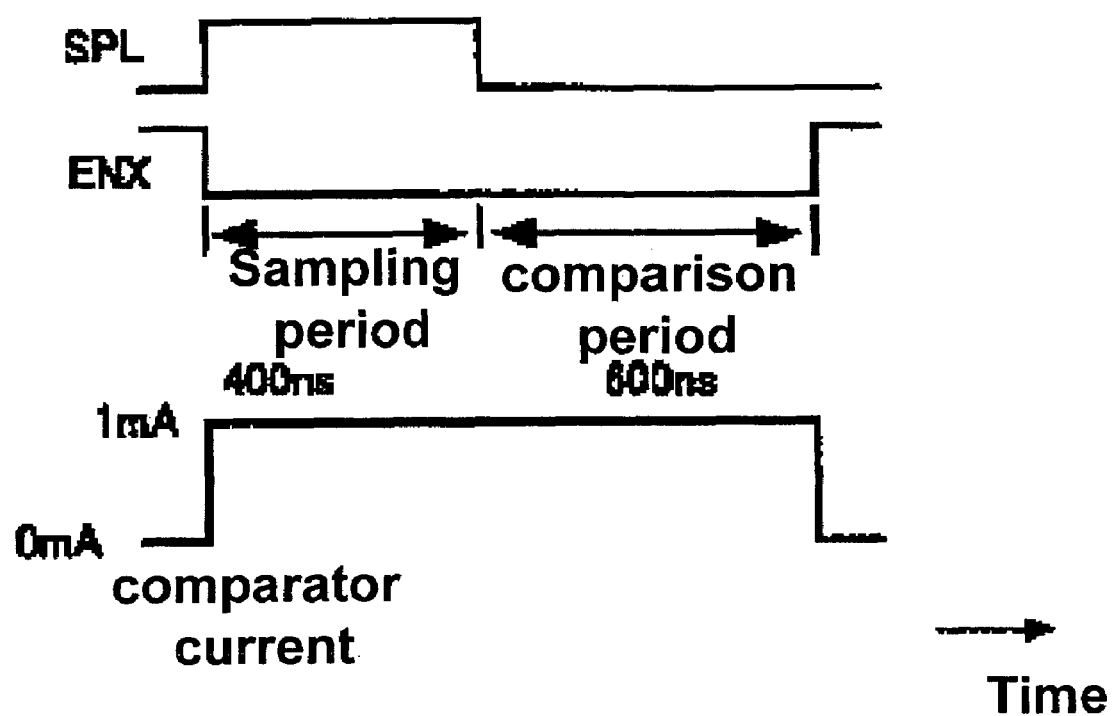
FIG. 10 is a timing chart illustrating advantages of the successive approximation type AD converter circuit of FIG. 8.
Figure 11:
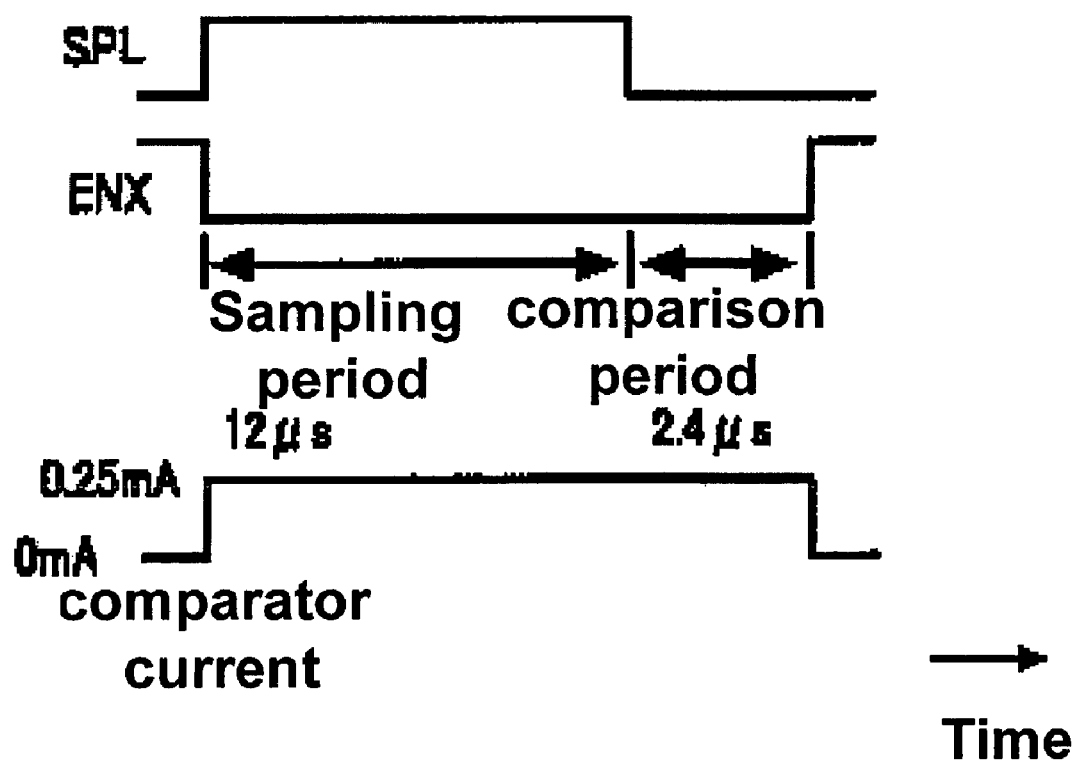
FIG. 11 is a timing chart illustrating advantages of the successive approximation type AD converter circuit of FIG. 8.

FIGS. 10 and 11 are timing charts illustrating beneficial effects of the successive approximation type AD converter circuit 25 of FIG. 8. FIG. 10 shows an example where AD-conversion is performed in an AD-conversion period of, for example, 1 μs. FIG. 11 shows an example where AD-conversion is performed in an AD-conversion period of, for example, 14.4 μs because of high impedance of the analog signal source.

Under the condition of FIG. 10, the cycle time of the clock signals CKINC and CKINS is set to about 60 ns for illustrative purposes. The sampling period is set to 7 cycles in terms of clock signal CKINS, the sampling period is set to about 400 ns, and the comparison period is set to about 600 ns on the assumption that the 10-bit ADC 37 is used. A period necessary for 1-bit comparison is about 60 ns, so a comparator current is 1 mA by way of example. An impedance of the analog signal source under the condition of FIG. 10 is, for example, 1 kΩ.

Under the condition of FIG. 11, an impedance of the analog signal source under the condition of FIG. 10 is set to, for example, 30 kΩ. The cycle time of the clock signals CKINC and CKINS is set to about 240 ns, the sampling period is set to 50 cycles in terms of clock signal CKINS, the sampling period is about 12 μs, and the comparison period is about 2400 ns.

If an impedance of the analog signal source is high, it is necessary to set the sampling period long. If the impedance of the analog signal source is 30 kΩ, the sampling period is set 30 times longer than that in the case where the signal source impedance is 1 kΩ on the assumption that parameters other than the analog signal source impedance are not considered for ease of explanation. That is, the requisite sampling period is about 12 μs, which is 30 times longer than 400 ns.

In the successive approximation type AD converter circuit 25 of FIG. 9, the cycle time of the clock signal CKINS for determining a sampling period and the cycle time of the clock signal CKINC for determining a comparison period can be independently set. Thus, although, the cycle time of the clock signal CKINC is set to about 60 ns as in the example of FIG. 10, the comparison period is about 600 ns in this case, and the AD-conversion period is 12.6 μs. In this case, the comparator in the ADC 37 needs to perform comparison within a period of about 60 ns per bit, so the comparator current should be set to 1 mA. On the other hand, if the cycle time of the clock signal CKINC is set to about 240 ns as in the example of FIG. 11, the sampling period is as long as about 12 μs, so the comparison period is set long not to extremely increase the total AD-conversion period to thereby attain an effect of reducing a current. If the comparison period is set to about 2400 ns, the comparison can be performed about 4 times as slowly as the comparison period of about 600 ns. Thus, the comparator current can be reduced to about ¼. That is, even if the comparator current is 0.25 mA, the AD-conversion can be carried out. Hence, the register 38 is used to set the comparator current of the ADC 37 to about ¼ of that in the minimum AD-conversion period to thereby save a current consumed by the ADC 37.

Incidentally, in the example of FIG. 11, the sampling period is about 12 μs. However, if an impedance of the analog signal source is much higher, the sampling period needs to be set to, for example, about 1.2 ms, and the maximum count value of the counter circuit 36 in the sampling period is 50, the comparison period is as long as about 240 μs in the conventional circuit of FIG. 3. In other words, the comparison period is about 400 times as long as about 600 ns with the minimum AD-conversion period. As a result, an amount of a leak current described as the problem inherent in the conventional circuit of FIG. 3 increases nearly 400-fold, and it is difficult to obtain a correct AD-conversion result. In contrast, in the successive approximation type AD converter circuit 25 of FIG. 8, even if the sampling period is about 1.2 ms, as long as the cycle time of the clock signal MCLK of the MCU 21 permits, the comparison period can be set shorter than about 240 μs, for example, set to about 30 μs. Therefore, it is possible to set as long a sampling period as possible as well as overcome the problem of the leak current.

As described above, according to the successive approximation type AD converter circuit 25 of FIG. 8, the sampling period (sampling time) can be set to the maximum value that is determined in accordance with the maximum count value of the counter circuit 36 and the maximum cycle time of the clock signal CKINS, and the comparison period can be set equal to or smaller than the predetermined maximum value that is determined in accordance with a leak current of a circuit portion.

Further, the register 38 is provided to set a current value of a comparator current or the like in the ADC 37 by use of software, making it possible to set a current of the ADC 37 smaller and save an energy necessary for AD-conversion and average power consumption for AD-conversion.

Incidentally, in the illustrated example of FIG. 8, 1/1, 1/2, 1/4, and 1/8 are given as selectable division ratios of the divider circuits 31 and 32 by way of example. However, the division ratio is not limited to these values but may be, of course, set to a division ratio other than these values. Further, in the above explanation, specific numerical values are not given as options for the maximum count value of the counter circuit 36 and the count value of the counter circuit 36, but these values may be, of course, freely set without departing from the scope of the present invention.

Figure 12:
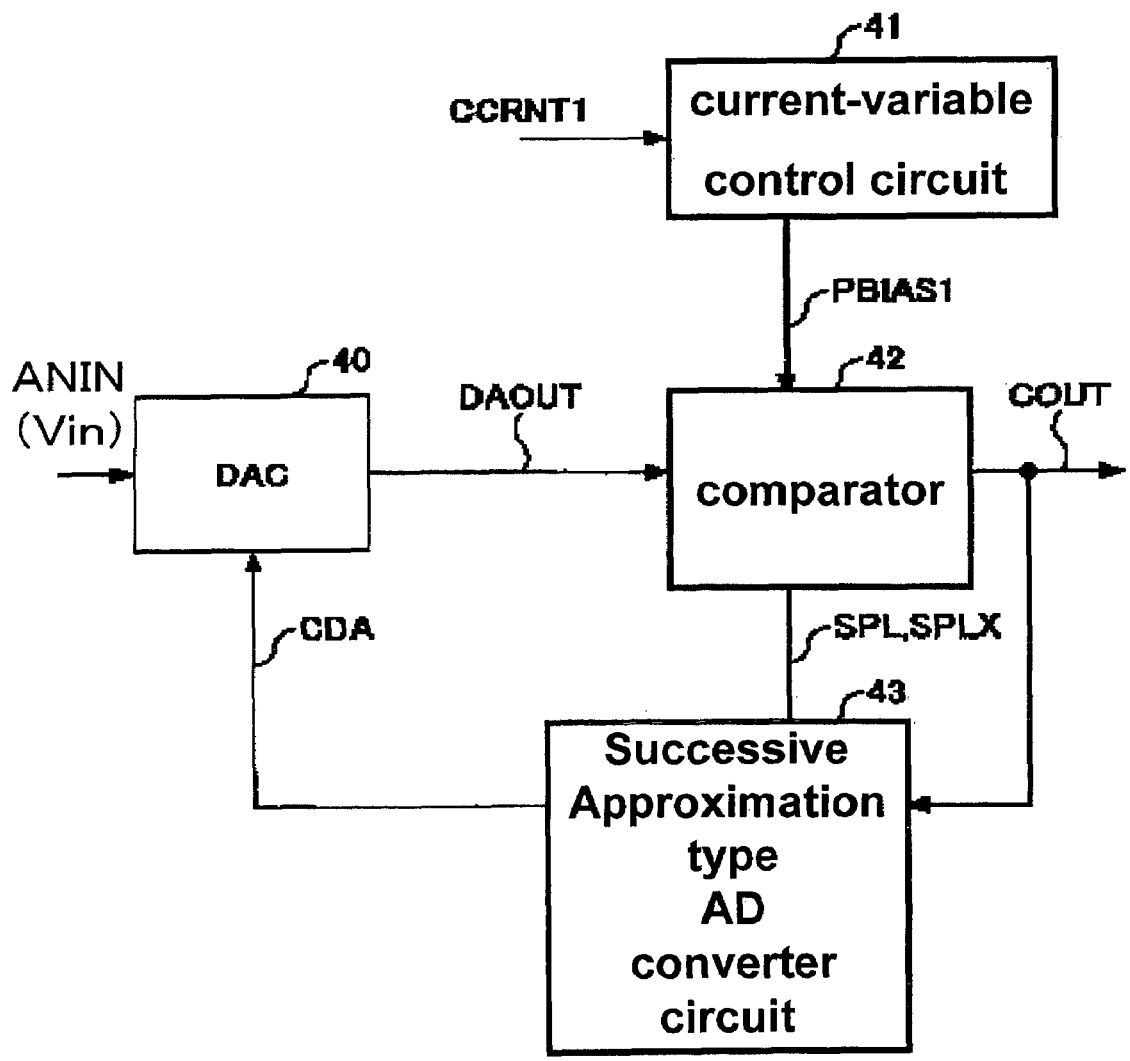
FIG. 12 is a block diagram showing an example of an ADC.

FIG. 12 is a block diagram showing an example of the ADC 37. The ADC 37 includes a DAC 40, a current-variable control circuit 41, a comparator 42, and a successive approximation type AD converter circuit 43, which are connected with one another as shown in FIG. 12.

The DAC 40 includes a capacitor DAC or a composite DAC, and functions to receive an analog input signal ANIN and supply an output DAOUT to the comparator 42. The current-variable control circuit 41 receives a control signal CCRNT1 and supplies a control signal PBIAS1 for controlling a current of the comparator 42 to the comparator 42. The successive approximation type AD converter circuit 43 generates and outputs a control signal SPL for setting a sampling period and a control signal CDA for controlling the DAC 40 on the basis of the comparator output COUT. The control signal SPL is supplied to the comparator 42 and the control signal CDA is supplied to the DAC 40.

Figure 13:
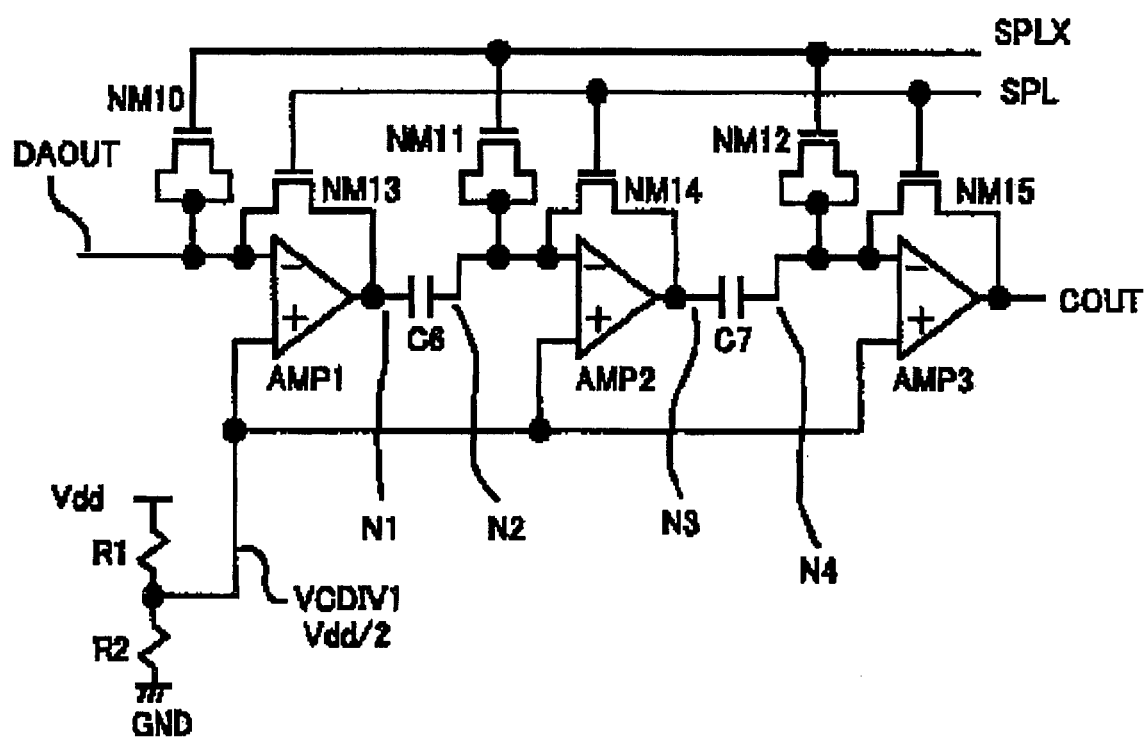
FIG. 13 is a circuit diagram showing a comparator in the ADC of FIG. 12.

FIG. 13 is a circuit diagram showing the comparator 42 in the ADC 37 of FIG. 12. In FIG. 13, substantially the same components as those of FIG. 1 are denoted by identical reference numerals. The comparator 42 includes differential amplifier circuits AMP1, AMP2, and AMP3, NMOS transistors NM10 to NM15, capacitors C6 and C7, and resistors R1 and R2. Reference symbol Vdd denotes a power supply voltage of, for example, +3V; DAOUT, an output of the DAC 40 of FIG. 12; SPL and SPLX, a control signal for sampling (SPLX is a signal opposite in phase to SPL); GND, a ground voltage of 0 V; N1 to N4, a node in the comparator 42; COUT, a comparator output; and VCDIV1 (=Vdd/2), a reference input potential of a differential amplifier circuit.

The comparator 42 of FIG. 13 controls a comparator current in accordance with the value set in the register 38 of FIG. 8, and if an impedance of the analog signal source is high, sets a comparator current to a small value to save current consumption of the ADC 37. For that purpose, the circuit configuration that can set a current flowing through the comparator 42 variable, is required.

Figure 14:
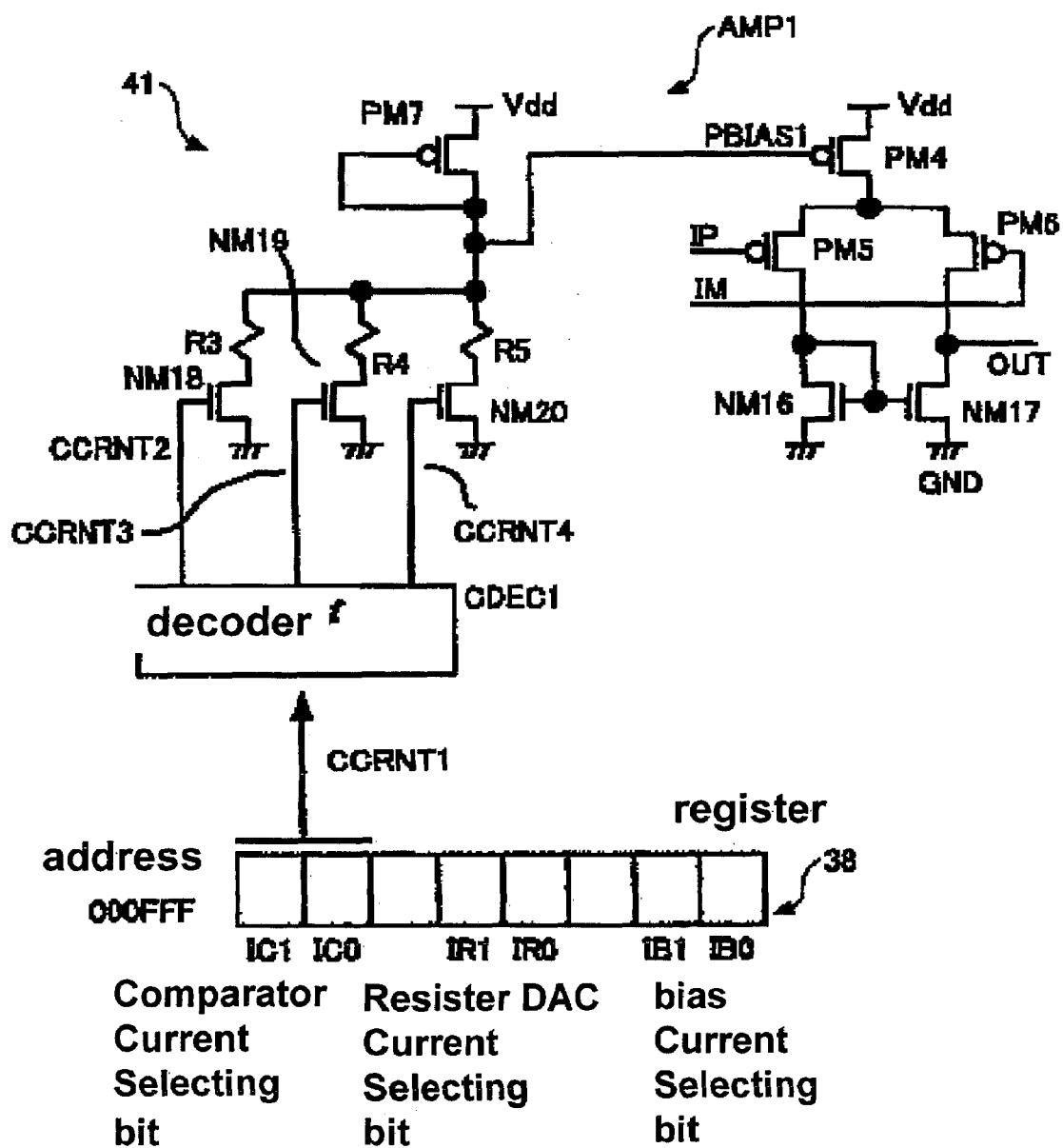
FIG. 14 is a circuit diagram showing a configuration of a differential amplifier circuit of FIG. 13 together with a register of FIG. 8 and a current-variable control circuit of FIG. 12.

FIG. 14 is a detailed circuit diagram of transistors of the comparator 42 that can make a current flowing through the comparator 42 variable. FIG. 14 shows the configuration of the differential amplifier circuit AMP1 together with the register 38 of FIG. 8 and the current-variable control circuit 41 of FIG. 12. The configuration of the differential amplifier circuits AMP2 and AMP3 may be the same as that of the differential amplifier circuit AMP1 and thus is neither shown nor described.

Referring to FIGS. 13 and 14, operations of the comparator 42 are described.

In the register 38 of FIG. 14, reference symbols IC1 and IC0 denote a comparator current selecting bit; IR1 and IR0, a resistor DAC current selecting bit as described later; and IB1 and IB0, a bias current selecting bit. The current-variable control circuit 41 includes a decoder CDEC1, NMOS transistors NM18 to NM20, a PMOS transistor PM7, and resistors R3 to R5. The decoder CDEC1 decodes the comparator current selecting bits Ic1 and IC0 to generate control signals CCRNT2, CCRNT3, and CCRNT4 for controlling a current of the comparator 42. Reference symbol Vdd denotes a power supply voltage of, for example, +3V; and GND, a ground voltage of 0 V. The differential amplifier circuit AMP1 includes NMOS transistors NM16 and NM17 and PMOS transistors PM4 to PM6. Denoted by IP and IM is an input of the differential amplifier circuit AMP1. OUT denotes an output of the differential amplifier circuit AMP1.

The transistors NM10, NM11, and NM12 of FIG. 13 are applied with the control signal SPLX in opposite phase to the control signal SPL at their gates to thereby function as capacitors that make up for clock field through of the transistors NM13, NM14, and NM15. The control signal SPL of FIG. 13 functions as a control signal for sampling similar to the control signal SPL of FIG. 1. The differential amplifier circuit AMP1, AMP2, and AMP3 and the transistors NM13, NM14, and NM15 function almost similar to the comparator of FIG. 1 except that the amplifier circuit is a differential amplifier circuit and thus a reference input potential VCDIV1 is applied to a positive (+) input terminal (noninverting input terminal) of each of the differential amplifier circuit AMP1, AMP2, and AMP3. If the reference input potential VCDIV1 that is obtained by dividing the power supply voltage Vdd to, for example, ½ with the resistors R1 and R2, is applied to the +input terminals of the differential amplifier circuit AMP1, AMP2, and AMP3, an output DAOUT of the DAC 40 upon sampling, the nodes N1 to N4, and a potential of a comparator output COUT can be approximately set to the reference input potential VCDIV1. The capacitors C6 and C7 of FIG. 13 function as elements for storing an offset voltage of the differential amplifier circuit AMP1, AMP2, and AMP3 as in the example of FIG. 1.

Incidentally, a circuit composed of the resistors R1 and R2 and generating the reference input potential VCDIV1 may be provided in the comparator 42 or outside the comparator 42.

An address of the register 38 of FIG. 14 is illustrated as 000FFF for convenience of explanation. A value is set in the address 000FFF with a program of the MCU 21 to set the comparator current selecting bits IC1 and IC0 to a desired value. The control signals CCRNT2 to CCRNT4 are generated with the decoder CDEC1 on the basis of the comparator current selecting bits IC1 and IC0 to control a current flowing through the differential amplifier circuit AMP1, AMP2, and AMP3. In the example of FIG. 14, the register 38 having the address 000FFF includes a current control bit for controlling a current of the resistor DAC and a bias-current selecting bit as described later as well as a bit for controlling the comparator current.

FIG. 1 shows a circuit example where the successive approximation type ADC is configured by the capacitor DAC alone for simple illustration, but if the successive approximation type ADC is configured by CR (capacitor-resistor) composite DAC that AD-converts a lower bit with the resistor DAC, a comparator current is set in the register 38 and in addition, a current of the resistor DAC is set in the register by use of software to thereby enhance the effect of saving a current described with reference to FIGS. 8, 10, and 11. If the comparator 42 of FIG. 13 is used, a steady-state current flows through not only the differential amplifier circuit AMP1, AMP2, and AMP3 of the comparator 42 cut also a circuit portion for generating the reference input potential VCDIV1. Thus, it is desirable to set a current of the circuit portion in the register 38. The current selecting bits IR1, IR0, IB1, and IB0 of FIG. 14 are used to set a current of the resistor DAC and a current of the circuit portion for generating the reference input potential VCDIV1.

For example, if the circuit is designed such that resistance values of the resistors R3, R4, and R5 satisfy a relationship of R3<R4<R5, the control signal CRNT2 is set to H level and the control signals CCRNT3 and CCRNT4 are set to L level under control. In this case, the transistors NM19 and NM20 are turned off and the transistor NM18 is turned on, a current flowing through the transistor PM7 is determined in accordance with a resistance value of the resistor R3 and a voltage along the resistor. A potential of the bias signal PBIAS1 is determined in accordance with the current flowing through the transistor PM7 and the transistor PM4 functions as a current mirror of the transistor MP7.

If the control signals CCRNT2 and CCRNT3 are at L level, and the control signal CCRNT4 is at H level under control, a current flowing through the transistor PM7 is determined in accordance with a resistance value of the resistor R5 and a voltage applied across the resistor. The control signals CCRNT2 to CCRNT4 are switched to H or L level under control on the basis of the above relationship of R3<R4<R5, that is, the comparator current selecting bits IC1 and IC0 are set in the register 38, making it possible to set a comparator current variable by use of software. As in the circuit of FIG. 1, if a current is allowed to flow through the comparator 42 only when the ADC is operating, any one of the control signals CCRNT2 to CCRNT4 may be set to H level during a period in which a current flows through the comparator 42. As a result, the control signals CCRNT2 to CCRNT4 function as a signal for selecting a comparator current as well as a control signal similar to the control signal ENX of FIG. 1. Incidentally, an actual circuit configuration of the circuit portion including the register 38 and the current-variable control circuit 41 is not limited to the circuit configuration of FIG. 14, and various circuit configurations can be employed. Needless to say, any other configuration are applicable to the successive approximation type AD converter circuit 25 of FIG. 8 as long as these can execute requisite timing control (like the control of the control signal ENX of FIG. 1, for example) and set a current by use of software.

As described above, the comparator 42 configured as shown in FIGS. 13 and 14 is employed to thereby make a current such as a comparator current of the ADC 37 variable in accordance with the sampling period, the AD-conversion period, and the comparison period of the comparator.

In the examples of FIGS. 13 and 14, the differential amplifier circuits AMP1 to AMP3 constitute the comparator 42 and the comparator current and the bias current are variable by way of example, but a specific transistor circuit configuration can be variously modified as described later, and it is needless to say that various circuit configurations can be employed without departing from the scope of the present invention.

Figure 15:
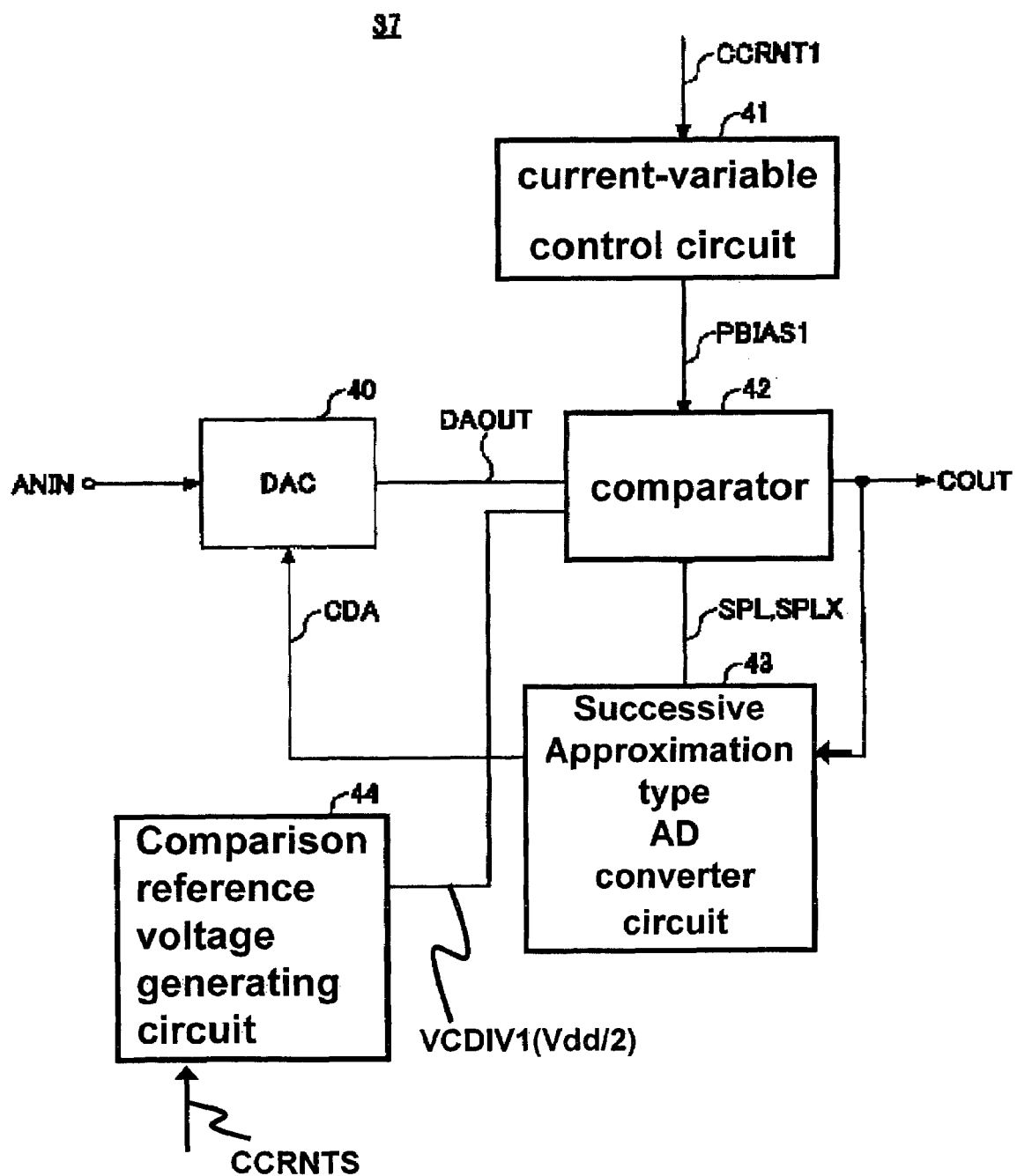
FIG. 15 is a block diagram showing another example of an ADC.

FIG. 15 is a block diagram showing another example of the ADC 37. In FIG. 15, the same components as those of FIG. 12 are denoted by identical reference numerals, and description thereof is omitted. The ADC 37 of FIG. 15 further includes a comparison reference voltage generating circuit 44. The comparison reference voltage generating circuit 44 generates the reference input potential VCDIV1 in accordance with the control signal CCRNT5 and supplies the generated potential to the comparator 42.

Figure 16:
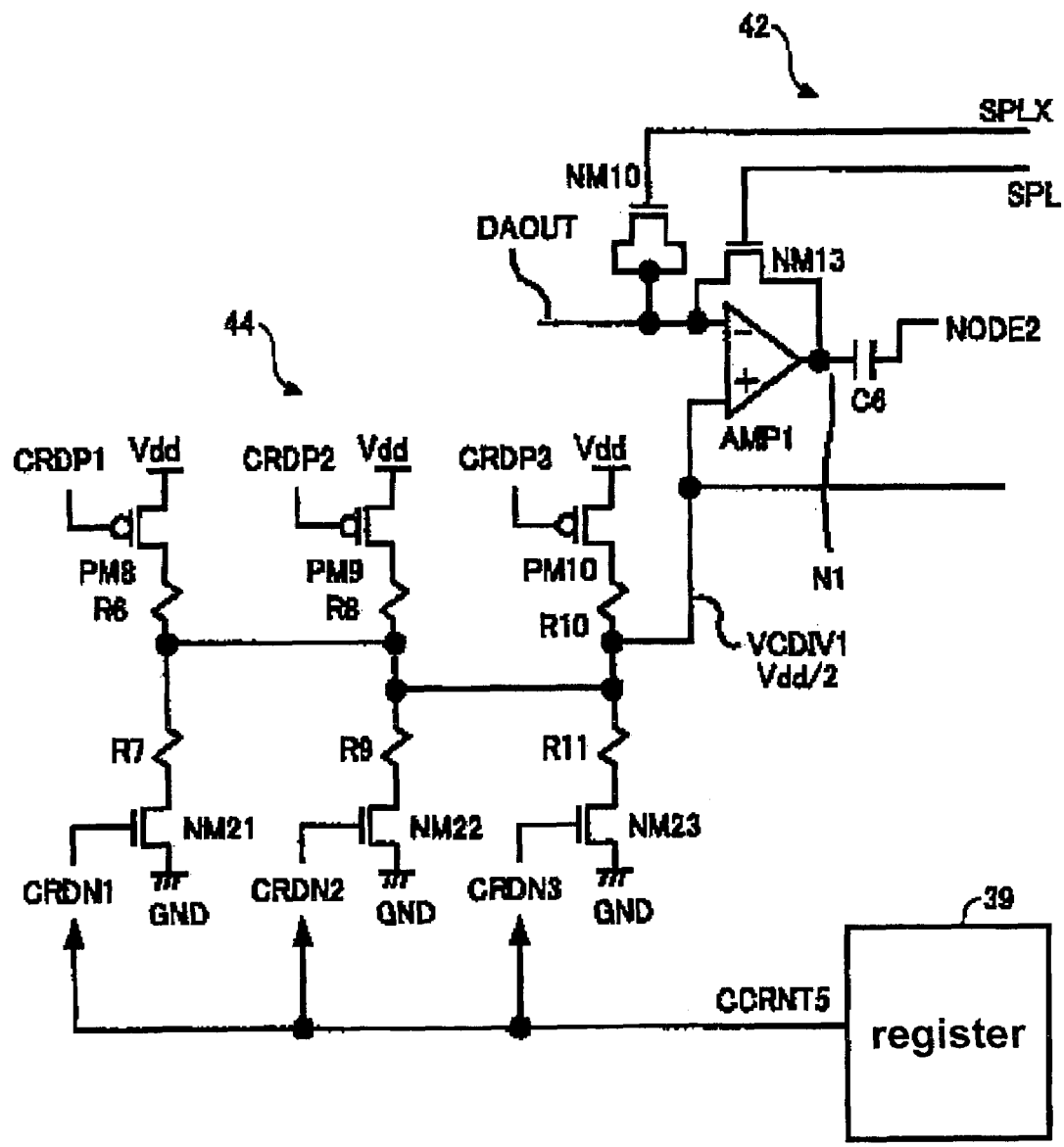
FIG. 16 is a circuit diagram showing a configuration of a comparison reference voltage generating circuit in the ADC of FIG. 15 together with a part of the comparator.

FIG. 16 is a circuit diagram showing the configuration of the comparison reference voltage generating circuit 44 in the ADC 37 of FIG. 15 together with a part of the comparator 42. In FIG. 16, the same components as those of FIG. 13 are denoted by identical reference numerals and description thereof is omitted. FIG. 16 shows the case where the register is set to make a current of the comparison reference voltage generating circuit 44 variable, the circuit 44 being used to generate the reference input potential VCDIV1 supplied to the + input terminal of the differential amplifier circuits AMP1, AMP2, and AMP3 of the comparator 42 of FIG. 13.

The comparison reference voltage generating circuit 44 includes AMOS transistors PM8 to PM10, NMOS transistors NM21 to NM23, and resistors R6 to R11, which are connected with one another as shown in FIG. 16. Reference symbols CRDP1, CRDP2, and CRDP3 denote controls signals of the PMOS transistors PM8 to PM10; CRDN1, CRDN2, CRDN3, control signals of the NMOS transistors NM21 to NM23; and CCRNT5, a control signal from the register 39 provided in the successive approximation type AD converter circuit 25. The control signals CRDP1 and CRDN1 are opposite in phase, the control signals CRDP2 and CRDN2 are opposite in phase, and CRDP3 and CRDN3 are opposite in phase. The control signal CCRNT5 is a generic name for the control signals CRDP1, CRDN1, CRDP2, CRDN2, CRDP3, and CRDN3. The resistors R6 and R7 have the same resistance value, the resistors R8 and R9 have the same resistance value, and the resistors R10 and R11 have the same resistance value.

In FIGS. 13 and 14, a tail current of the differential amplifier circuits AMP1 to AMP3 that constitute the comparator 42 is made variable to set a comparator current by use of software. Similar to the above, a current of the comparison reference voltage generating circuit 44 for generating the reference input potential VCDIV1 can be made variable. FIG. 16 shows the circuit configuration in this case. In FIG. 13, it is assumed that the reference input potential VCDIV1 is generated by dividing the power supply voltage Vdd with the resistors R2 and R3 for ease of explanation. However, as is understood from the above description, if a current of each component of the comparator 42 as well as a current of the differential circuit of the comparator 42 can be set in accordance with the sampling period and the AD-conversion period, the effect of saving power can be further enhanced.

Here, one of the control signals CRDN1, CRDN2, and CRDN3 is at H level, and the other control signals are at L level by way of example. For example, if the control signal CRDN1 is at H level, the transistors PM8 and NM21 are turned on, and the transistors PM9, PM10, NM22, and NM23 are turned off. If on-resistances of the transistors PM8, PM9, PM10, NM21, NM22, and NM23 are assumed much lower than resistance values of the resistors R6 to R11, a current flowing through the comparison reference voltage generating circuit 44 for generating the reference input potential VCDIV1 when the control signal CRDN1 is at H level is determined in accordance with the power supply voltage Vdd and resistance values of the resistors R6 and R7. Since the resistors R6 and R7 have the same resistance value, the reference input potential VCDIV1 is ½ of the power supply voltage Vdd. The same holds true of operations in the case where the control signal CRDN2 or CRDN3 is at H level. A point of difference corresponds to a difference in resistance value between the resistor R6 and the resistors R8 and R10. A resistance value of a voltage divider circuit composed of the resistors R6 and R7 is selected on the basis of a value set in the register 39, that is, the control signal CCRNT5, thereby making it possible to select a current of the comparison reference voltage generating circuit 44 for generating the reference input potential VCDIV1 by use of software.

In the illustrated example of FIG. 14, a current of the comparison reference voltage generating circuit 44 is set with the bias current selecting buts IB1 and IB0. However, as shown in FIG. 16, a resister 39 may be provided individually of the register 38. Further, as in the example of FIG. 14, the other register may be partially used. In short, the circuit is so configured as to easily obtain a requisite bit rate at the time of setting a current of the comparison reference voltage generating circuit 44.

As described above, a current of the comparison reference voltage generating circuit 44 for generating the reference input potential VCDIV1 of the differential amplifier circuit constituting the comparator 42 can be set with the circuit of FIG. 16 by use of software.

Figure 17:
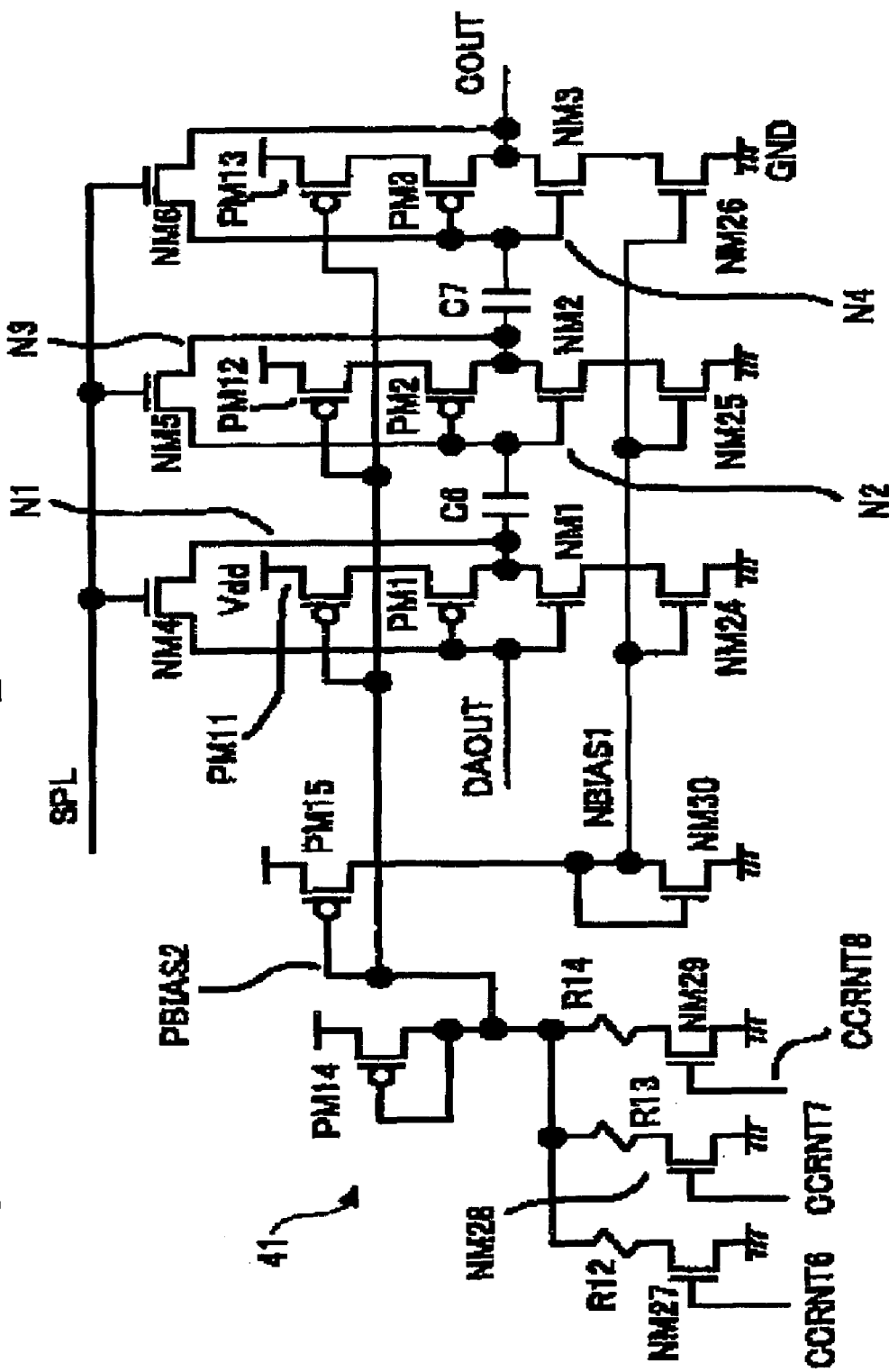
FIG. 17 is a circuit diagram showing another example of the comparator in the ADC of FIG. 12 together with a current-variable control circuit.

In the illustrated example of FIG. 13, the comparator 42 includes differential amplifier circuits. However, the comparator 42 may be configured by a single-ended circuit as shown in FIG. 17 and its current is made variable. FIG. 17 is a circuit diagram showing another example of the comparator 42 in the ADC 37 together with the current-variable control circuit 41. In FIG. 17, substantially the same components as those of FIG. 1 are denoted by identical reference numerals, and description thereof is omitted.

The comparator 42 includes NMOS transistors NM1 to NM6 and NM24 to NM26, PMOS transistors PM1 to PM3 and PM11 to PM13, and capacitors C6 and C7, which are connected with one another as shown in FIG. 13. The current-variable control circuit 41 includes PMOS transistors PM14 and PM15, NMOS transistors NM27 to NM30, and resistors R12 to R14, which are connected with one another as shown in FIG. 17. In FIG. 17, reference symbol PBIAS2 denotes a bias potential of the PMOS transistor PM15; and NBIAS1, a bias potential of the NMOS transistors NM24 to NM26. CCRNT6 to CCRNT8 function as a signal to control the comparator current as well as a control signal similar to the control signal ENX of FIG. 1.

As for the comparator 42 of FIG. 17, the transistors PM11, PM12, PM13, NM24, NM25, and NM26 are provided so as to variably control the comparator current. Gates of the transistors PM11, PM12, PM13, NM24, NM25, and NM26 are applied with the bias potentials PBIAS2 and NBIAS1 for setting a comparator current to a desired value under control. As a result, the comparator circuit is changed in accordance with a value of the register 38.

For example, if only one of the control signals CCRNT6 to CCRNT8 is set to H level, a current that is determined in accordance with resistance values of the resistors R12, R13, and R15 and voltages applied across the individual resistors, is allowed to flow through the transistor PM14. The gate potential PBIAS2 of the transistor PM14 is common to the gate potentials of the transistors PM11, PM12, PM13, and PM15, so the transistors PM11, PM12, PM13, and PM15 and the transistor PM14 constitute a current mirror circuit. A current flowing through the transistor PM14 also flows through the transistors PM11, PM12, PM13, and PM15. That is, a current flowing through the transistors PM11, PM12, PM13, and PM15 can be controlled in accordance with a current flowing through the transistor PM14, and a current of the transistor PM14 is made variable by use of any one of the resistors R12 to R14, so a current of the transistors PM11, PM12, PM13, and PM15 can be made variable under control in accordance with the control signals CCRNT6, CCRNT7, and CCRNT8.

Likewise, a current of the transistor PM15 flows through the transistor NM30, and a gate potential NBIAS1 of the transistor NM30 is common to gate potentials of the transistors NM24, NM25, and NM26. A current of the transistor PM15 is the same as the current of the transistor PM14 and thus currents of the transistors NM24, NM25, and NM26 can be also made variable under control in accordance with the control signals CCRNT6, CCRNT7, and CCRNT8.

As described above, if the circuit is configured as shown in FIG. 17, the comparator 42 can be configured by a single-ended circuit and its current can be made variable.

Incidentally, in the example of FIG. 1, the successive approximation type AD converter circuit 1 is configured by only a capacitor DAC for ease of illustration, but in the actual successive approximation type AD converter circuit, a capacitor-resistor composite DAC for converting an upper bit with a capacitor DAC and converting a lower bit with a resistor DAC, for example, may be used in order to realize resolution of about 10 bits with as small footprint as possible. In such cases, it is preferred that a current of the resistor DAC as well as the comparator current be set in a register to select the minimum current from set current values necessary to obtain a desired AD-conversion period (comparison period of the comparator) to thereby attain an effect of saving power consumption similar to that of the circuit of FIG. 8.

Figure 18:
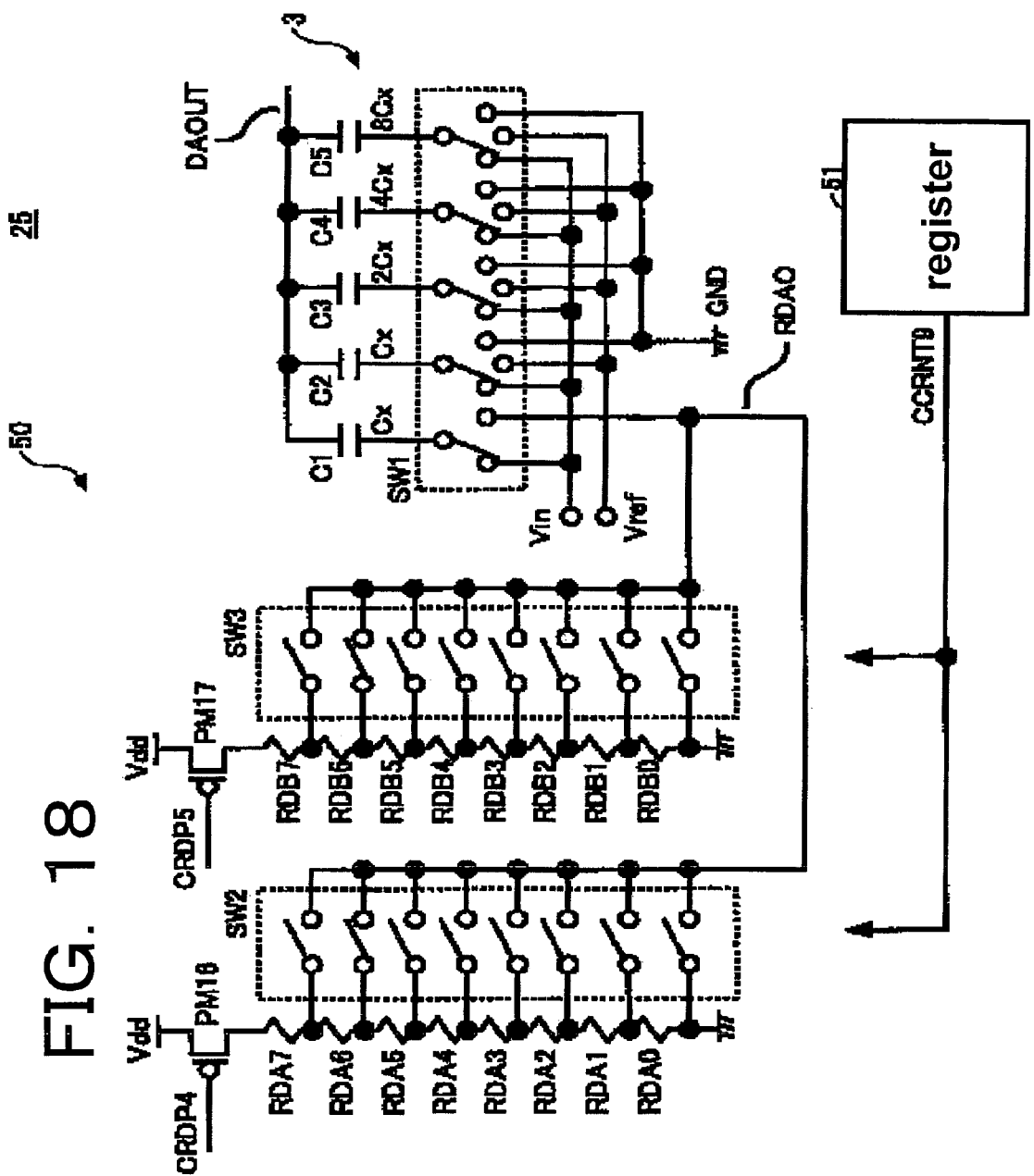
FIG. 18 is a circuit diagram showing main parts of a successive approximation type AD converter circuit including a resistor DAC.

FIG. 18 is a circuit diagram showing main parts of the successive approximation type AD converter circuit 25 including a resistor DAC. In FIG. 18, substantially the same components as those of FIGS. 1 and 13 are denoted by identical reference numerals, and description thereof is omitted. FIG. 18 shows such a circuit configuration as to make a current of the resistor DAC variable and set a current of the resistor DAC in a register. Incidentally, a part of the capacitor DAC is shown in FIG. 18 for ease of illustration.

The successive approximation type AD converter circuit 25 includes a resistor DAC 50, a register 51 for selecting a current for the resistor DAC 50, and a capacitor DAC 52, which are connected as shown in FIG. 18. Reference symbols SW1, SW2, and SW3 denote a switch portion including plural switches; C1 to C5, a capacitor; Vin, an analog input potential; Vdd, a power supply voltage of, for example, +3V; Vref, a reference voltage; DAOUT, an output of the capacitor DAC 3; GND, a ground voltage of 0 V; PM16 and PM17, a PMOS transistor; RDA0, an output of the resistor DAC 50; RDA0 to RDA7 and RDB1 to RDB7, a resistor; CRDP4 and CRDP5, a control signal for controlling a current of the resistor DAC 50; and CCRENT9, a control signal from the register 51.

A value for selecting a current for the resistor DAC 50 is set in the register 51 to thereby set either the control signal CRDP4 or the control signal CRDB5 to L level in accordance with the control signal CCRENT9 from the register 51. If the control signal CRDP4 is set to L level, the transistor PM16 is turned on, and the resistors RDA0 to RDA7 function as the resistor DAC. On the other hand, if the control signal CRDP5 is set to L level, the transistor PM17 is turned on, and the resistors RDB0 to RDB7 function as the resistor DAC. In the circuit configuration of FIG. 18, the resolution of the resistor DAC 50 is 3 bits for ease of illustration. Needless to say, however, the circuit configuration of FIG. 18 can be extended as appropriate for the resistor DAC having the resolution of 3 bits or more. If the transistor PM16 is turned on, a potential of one switch of the switch portion SW2 is output as an output RDA0 in accordance with the control signal CCRNT9, and the switches of the switch portion SW3 are all open (off). In contrast, if the transistor PM17 is turned on, a potential of one switch of the switch portion SW3 is output as an output RDA0 and the switches of the switch portion SW2 are all open.

The total resistance of the resistors RDA0 to RDA7 and the total resistance of the resistors RDB0 to RDB7 each determine a current for the resistor DAC 50. Hence, if the total resistance values are set to a desired value and the above control is performed, it is possible to select the minimum current of the set currents necessary to obtain a desired conversion period (comparison period of the comparator 42).

In the example of FIG. 14, a current of the resistor DAC 50 is determined with the current selecting bits IR1 and IR0 for selecting a current of the resistor DAC. However, a register 51 may be provided independently of the register 38 as shown in FIG. 18. Moreover, another register may be partially used as shown in FIG. 14. In short, the circuit is configured so as to ensure a necessary bit rate upon setting a current of the resistor DAC 50.

As described above, according to the embodiments, the clock signal CKINS for determining a sampling period and the clock signal CKINC for determining a comparison period are different clock signals. In addition, the registers 33 and 34 are provided to set division ratios of the divider circuits 31 and 32 for generating the clock signals CKINS and CKINC on the basis of the clock signal MCLK of the MCU 21. Thus, a cycle time of the clock signal CKINS for determining a sampling period can be set long and a cycle time of the clock signal CKINC for determining a comparison period can be set shorter than the above cycle time. In short, it is possible to maximize the sampling period as well as set the comparison period equal to or shorter than the predetermined maximum value that is determined in accordance with a leak current of the circuit.

Further, the register 38 is provided to directly set a current value of the comparator current or the like of the successive approximation type ADC 37 by use of software to thereby set and optimize the comparator current of the ADC 37 and currents of the other components in the comparator 42 by use of software. A frequency of the clock signal MCLK of the MCU 21 varies depending on an oscillator externally connected to the MCU 21, so the clock signal MCLK of the MCU 21 is not determined until a user of the MCU 21 completes board or system design. Therefore, a sampling period, an AD-conversion period, and a comparison period of the comparator are not determined in accordance with the count value of the counter circuit 36 alone, and are known by only the user of the MCU 21, who grasps the number of cycles of the clock signal MCLK of the MCU 21, the division ratio, or the like. Therefore, a programmer, who knows absolute value of these periods (time), needs to designate a value to minimize the total current on the basis of the requisite current by use of a program (software), but the embodiments can provide means for optimizing such a current.

What is claimed is:

1. An AD converter circuit that is a successive approximation type, comprising:
   a comparator for comparing an analog input signal with an output analog signal;
   a DA converter for outputting the output analog signal according to a digital signal output in accordance with a comparison result from the comparator;
   an AD converter for AD-converting the analog input signal to the digital signal output in accordance with a sampling period for sampling the analog input signal and comparison period for comparing the sampled analog input signal with the output analog signal of the DA converter, and for outputting an AD-converted output signal if the output analog signal of the DA converter is equal to the analog input signal; and
   setting means for independently setting a cycle time of a first clock signal for determining the sampling period and a cycle time of a second clock signal for determining the comparison period, wherein the setting means comprises:
   a first divider circuit for dividing a clock signal to generate the first clock signal;
   a second divider circuit for dividing the clock signal to generate the second clock signal and supply the generated clock signal to the AD converter; and
   a counter circuit for counting the number of the first clock signals to supply a control signal for setting the sampling period to the AD converter.

2. The AD converter circuit according to claim 1, further comprising:
   first and second registers in which a division ratio of the first divider circuit and a division ratio of the second divider circuit are separately set,
   the division ratios being supplied to the first and second divider circuits from the first and second registers.

3. The AD converter circuit according to claim 2, wherein a value of the first register and a value of the second register can be set by use of software.

4. The AD converter circuit according to claim 1, further comprising:
   a third register in which a count value of the counter circuit is set, the count value being supplied to the counter circuit from the third register.

5. A microcontroller having the AD converter circuit according to claim 4, comprising:
   a CPU; and
   a clock generating circuit for generating the clock;
   an AD converter circuit that is a successive approximation type, wherein the AD converter comprises:
   a comparator for comparing an analog input signal with an output analog signal;
   a DA converter for outputting the output analog signal according to a digital signal output in accordance with a comparison result from the comparator;
   an AD converter for AD-converting the analog input signal to the digital signal output in accordance with a sampling period for sampling the analog input signal and comparison period for comparing the sampled analog input signal with the output analog signal of the DA converter, and for outputting an AD-converted output signal if the output analog signal of the DA converter is equal to the analog input signal;
   setting means for independently setting a cycle time of a first clock signal for determining the sampling period and a cycle time of a second clock signal for determining the comparison period;
   a third register in which a count value of the counter circuit is set,
   the count value being supplied to the counter circuit from the third register,
   wherein the setting means comprises:
   a first divider circuit for dividing a clock signal to generate the first clock signal;
   a second divider circuit for dividing the clock signal to generate the second clock signal and supply the generated clock signal to the AD converter; and
   a counter circuit for counting the number of the first clock signals to supply a control signal for setting the sampling period to the AD converter.

6. The microcontroller according to claim 5, wherein the CPU sets a value of the first register and a value of the second register by way of software.

7. The AD converter circuit according to claim 4, wherein a value of the third register can be set by use of software.

8. The AD converter circuit according to claim 1, further comprising:
a fourth register in which a current value of a current in the comparator is set, the current value being supplied to the AD converter from the fourth register.

9. The AD converter circuit according to claim 8, wherein a value of the fourth register can be set by use of software.

10. The type AD converter circuit according to claim 1, wherein the DA converter is one converter selected from the group consisting of a capacitor DA converter, a resistor DA converter, and a DA converter that combines a capacitor DA converter and a resistor DA converter.

11. The AD converter circuit according to claim 1, wherein the comparator comprises a plurality of differential amplifier circuits, and the AD converter comprises a reference voltage generating circuit for applying a comparison reference potential to a positive input terminal of each of the differential amplifier circuits and a fifth register in which a current value of a current of a resistance-divided circuit for generating the comparison reference potential.

12. The AD converter circuit according to claim 11, wherein a value of the fifth register can be set by use of software.

13. The AD converter circuit according to claim 1, wherein the comparator comprises a plurality of single-ended amplifier circuits, and the AD converter comprises a current mirror circuit for determining a current value of a current of each of the signal-ended amplifier circuits.

14. A microcontroller having the AD converter circuit according to claim 1, comprising:
a CPU; and
a clock generating circuit for generating the clock.

15. A microcontroller, comprising:
a CPU;
a clock generating circuit for generating the clock; and
an AD converter circuit that is a successive approximation type, wherein the AD converter comprises:
a comparator for comparing an analog input signal with an output analog signal;
a DA converter for outputting the output analog signal according to a digital signal output in accordance with a comparison result from the comparator;
an AD converter for AD-converting the analog input signal to the digital signal output in accordance with a sampling period for sampling the analog input signal and comparison period for comparing the sampled analog input signal with the output analog signal of the DA converter, and for outputting an AD-converted output signal if the output analog signal of the DA converter is equal to the analog input signal;
setting means for independently setting a cycle time of a first clock signal for determining the sampling period and a cycle time of a second clock signal for determining the comparison period;
first and second registers in which a division ratio of the first divider circuit and a division ratio of the second divider circuit are separately set; and
the division ratios being supplied to the first and second divider circuits from the first and second registers,
wherein the selling means comprises:
a first divider circuit for dividing a clock signal to generate the first clock signal;
a second divider circuit for dividing the clock signal to generate the second clock signal and supply the generated clock signal to the AD converter; and
a counter circuit for counting the number of the first clock signals to supply a control signal for setting the sampling period to the AD converter.

16. The microcontroller according to claim 15, wherein the CPU sets a value of the first register and a value of the second register by way of software.

* * * * *